(12) United States Patent
Huang

(10) Patent No.: US 6,974,766 B1
(45) Date of Patent: Dec. 13, 2005

(54) IN SITU DEPOSITION OF A LOW κ DIELECTRIC LAYER, BARRIER LAYER, ETCH STOP, AND ANTI-REFLECTIVE COATING FOR DAMASCENE APPLICATION

(75) Inventor: Judy H. Huang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/270,039

(22) Filed: Mar. 16, 1999

Related U.S. Application Data

(63) Continuation-in-part of application No. 09/219,945, filed on Dec. 23, 1998, and a continuation-in-part of application No. 09/165,248, filed on Oct. 1, 1998.

(51) Int. Cl.[7] ............................................. H01L 21/311

(52) U.S. Cl. ...................... 438/624; 438/763; 438/778; 438/931; 438/952; 438/740; 427/99

(58) Field of Search ................................ 438/763, 778, 438/931, 952, 740, FOR 355, FOR 395, 438/624; 427/99

(56) References Cited

U.S. PATENT DOCUMENTS

| | | | | |
|---|---|---|---|---|
| 4,262,631 A | | 4/1981 | Kubacki ...................... | 118/723 |
| 4,532,150 A | * | 7/1985 | Endo et al. | |
| 4,634,601 A | | 1/1987 | Hamakawa et al. ........... | 427/39 |
| 4,759,947 A | | 7/1988 | Ishihara et al. ................ | 427/38 |
| 4,872,947 A | * | 10/1989 | Wang et al. | |
| 4,895,734 A | | 1/1990 | Yoshida et al. ................ | 427/38 |
| 4,951,601 A | | 8/1990 | Maydan et al. .............. | 118/719 |

(Continued)

FOREIGN PATENT DOCUMENTS

| | | | | |
|---|---|---|---|---|
| EP | 0 613 178 A2 | 2/1994 | ........... | H01L 21/90 |

(Continued)

OTHER PUBLICATIONS

Omar, M.A., "Elementary Solid State Physics: Principles and Applications," Lowell Technological Institute, Addison-Wesley Publishing Company, © 1975, pp.: 124, 125.

(Continued)

*Primary Examiner*—George Fourson
(74) *Attorney, Agent, or Firm*—Moser, Patterson & Sheridan

(57) ABSTRACT

The present invention provides a SiC material, formed according to certain process regimes, useful as a barrier layer, etch stop, and/or an ARC, in multiple levels, including the pre-metal dielectric (PMD) level, in IC applications and provides a dielectric layer deposited in situ with the SiC material for the barrier layers, and etch stops, and ARCs. The dielectric layer can be deposited with different precursors as the SiC material, but preferably with the same or similar precursors as the SiC material. The present invention is particularly useful for ICs using high diffusion copper as a conductive material. The invention may also utilize a plasma containing a reducing agent, such as ammonia, to reduce any oxides that may occur, particularly on metal surfaces such as copper filled features. The invention also provides processing regimes that include using an organosilane as a silicon and carbon source, perhaps independently of any other carbon source or hydrogen source, and preferably in the absence of a substantial amount of oxygen to produce a SiC with a dielectric constant of less than 7.0. This particular SiC material is useful in complex structures, such as a damascene structure and is conducive to in situ deposition, especially when used in multiple capacities for the different layers, such as the barrier layer, the etch stop, and the ARC and can include in situ deposition of the associated dielectric layer(s).

22 Claims, 11 Drawing Sheets

U.S. PATENT DOCUMENTS

| | | | |
|---|---|---|---|
| 5,000,819 A | 3/1991 | Pedder et al. ............... 156/643 |
| 5,011,706 A | 4/1991 | Tarhay et al. ................. 427/39 |
| 5,028,566 A * | 7/1991 | Lagendijk ................... 438/784 |
| 5,086,014 A | 2/1992 | Miyata et al. .............. 437/103 |
| 5,232,871 A | 8/1993 | Ho ............................. 437/190 |
| 5,238,866 A | 8/1993 | Bolz et al. ................... 437/100 |
| 5,314,724 A | 5/1994 | Tsukune et al. ............ 427/489 |
| 5,360,491 A | 11/1994 | Carey et al. ................ 136/256 |
| 5,362,526 A | 11/1994 | Wang et al. ................ 427/573 |
| 5,401,613 A | 3/1995 | Brewer et al. ............. 430/323 |
| 5,409,543 A | 4/1995 | Panitz et al. .................... 134/2 |
| 5,423,941 A | 6/1995 | Komura et al. ......... 156/643.1 |
| 5,427,621 A | 6/1995 | Gupta ............................ 134/1 |
| 5,451,263 A | 9/1995 | Linn et al. .................. 134/1.1 |
| 5,465,680 A | 11/1995 | Loboda ........................ 117/84 |
| 5,468,978 A | 11/1995 | Dowben ..................... 257/258 |
| 5,480,300 A | 1/1996 | Okoshi et al. .............. 432/241 |
| 5,525,550 A | 6/1996 | Kato ........................... 437/238 |
| 5,554,570 A | 9/1996 | Maeda et al. ............... 437/235 |
| 5,565,084 A | 10/1996 | Lee et al. .................... 205/646 |
| 5,591,566 A | 1/1997 | Ogawa ........................ 430/325 |
| 5,593,741 A | 1/1997 | Ikeda .......................... 427/579 |
| 5,618,619 A | 4/1997 | Petrmichl et al. ........... 428/334 |
| 5,627,105 A | 5/1997 | Delfino et al. .............. 438/627 |
| 5,641,607 A | 6/1997 | Ogawa et al. ........... 430/272.1 |
| 5,658,834 A | 8/1997 | Dowben ..................... 438/478 |
| 5,660,682 A | 8/1997 | Zhao et al. .................. 438/715 |
| 5,679,413 A | 10/1997 | Petrmichl et al. ........... 427/534 |
| 5,691,209 A | 11/1997 | Liberkowski .................. 437/7 |
| 5,710,067 A | 1/1998 | Foote et al. ................. 437/238 |
| 5,711,987 A | 1/1998 | Bearinger et al. ............. 427/7 |
| 5,726,097 A | 3/1998 | Yanagida .................... 438/653 |
| 5,730,792 A | 3/1998 | Camilletti et al. ...... 106/287.14 |
| 5,739,579 A | 4/1998 | Chiang et al. .............. 257/635 |
| 5,741,626 A | 4/1998 | Jain et al. .................... 430/314 |
| 5,776,235 A | 7/1998 | Camilletti et al. ....... 106/287.1 |
| 5,780,163 A | 7/1998 | Camilletti et al. .......... 428/446 |
| 5,789,316 A | 8/1998 | Lu ............................... 438/637 |
| 5,789,776 A | 8/1998 | Lancaster et al. ........... 257/296 |
| 5,801,098 A | 9/1998 | Fiordalice et al. .......... 438/692 |
| 5,817,572 A | 10/1998 | Chiang et al. .............. 438/624 |
| 5,817,579 A | 10/1998 | Ko et al. ..................... 438/740 |
| 5,818,071 A | 10/1998 | Loboda et al. ................ 257/77 |
| 5,821,168 A | 10/1998 | Jain ............................. 438/692 |
| 5,869,396 A | 2/1999 | Pan et al. .................... 438/647 |
| 5,876,891 A | 3/1999 | Takimoto et al. ............. 430/71 |
| 5,926,740 A | 7/1999 | Forbes et al. ............... 438/763 |
| 6,054,379 A | 4/2000 | Yau et al. .................... 438/623 |
| 6,071,809 A * | 6/2000 | Zhao ........................... 438/622 |
| 6,072,227 A | 6/2000 | Yau et al. .................... 257/642 |
| 6,103,456 A | 8/2000 | Tobben et al. ............... 430/317 |
| 6,107,192 A * | 8/2000 | Subrahmanyan et al. .... 438/637 |
| 6,114,259 A | 9/2000 | Sukharev et al. ............ 438/789 |
| 6,140,226 A | 10/2000 | Grill et al. ................... 438/637 |
| 6,147,009 A | 11/2000 | Grill et al. ................... 438/780 |
| 6,159,871 A * | 12/2000 | Loboda et al. .............. 438/786 |
| 6,245,662 B1 | 6/2001 | Naik et al. ................... 438/622 |
| 6,287,990 B1 * | 9/2001 | Cheung et al. .............. 438/780 |
| 6,291,334 B1 * | 9/2001 | Somekh ....................... 438/597 |
| 6,303,523 B2 | 10/2001 | Cheung et al. .............. 438/780 |
| 6,348,725 B2 | 2/2002 | Cheung et al. .............. 257/642 |
| 6,372,661 B1 | 4/2002 | Lin et al. ..................... 438/769 |
| 6,413,583 B1 | 7/2002 | Moghadam et al. ... 427/249.15 |
| 6,444,568 B1 | 9/2002 | Sundararajan et al. ...... 438/627 |
| 6,445,073 B1 | 9/2002 | Zhao ........................... 257/771 |
| 6,511,903 B1 | 1/2003 | Yau et al. .................... 438/623 |
| 6,511,909 B1 | 1/2003 | Yau et al. .................... 438/638 |
| 6,514,667 B2 | 2/2003 | Angelopoulos et al. ... 430/271.1 |
| 6,528,426 B1 | 3/2003 | Olsen et al. ................. 438/689 |
| 6,537,929 B1 | 3/2003 | Cheung et al. .............. 438/790 |
| 6,541,282 B1 | 4/2003 | Cheung et al. .................. 438/5 |
| 6,562,690 B1 | 5/2003 | Cheung et al. .............. 438/400 |
| 6,673,721 B1 | 1/2004 | Kim et al. ................... 438/725 |
| 2002/0000670 A1 | 1/2002 | Yau et al. .................... 257/759 |
| 2002/0045361 A1 | 4/2002 | Cheung et al. .............. 438/790 |

FOREIGN PATENT DOCUMENTS

| | | | | |
|---|---|---|---|---|
| EP | 0725440 A2 | 8/1996 | ......... H01L 25/532 |
| EP | 0725440 A2 * | 8/1996 | |
| WO | WO 99/33102 | 7/1998 | ......... H01L 21/767 |
| WO | 00 19498 | 4/2000 | ......... H01L 21/768 |

OTHER PUBLICATIONS

PCT International Search Report for PCT/US99/22425 Dated Feb. 2, 2000.

Ogawa et al., "Novel ARC Optimization Methodology for KrF Excimer Laser Lithography at Low K1 Factor", *Proceedings of the SPIE. Optical/Laser Microlithography V*, vol. 1674, 1992, pp. 362-375.

Dijkstra et al., "Optimization of Anti-Reflection Layers for Deep UV Lithography", *Proceedings of SPIE Optical/Laser Microlithography, Bellingham, SPIE*, vol. 1927, pp. 275-286.

PCT International Search Report dated Mar. 9, 2000, for PCT/US99/22424.

PCT Partial International Search Report datd Mar. 21, 2000, for PCT/US99/22317.

* cited by examiner

IN SITU DEPOSITION OF A LOW κ DIELECTRIC LAYER, BARRIER LAYER, ETCH STOP, AND ANTI-REFLECTIVE COATING FOR DAMASCENE APPLICATION

This application is a continuation-in-part of U.S. Ser. No. 09/165,248, entitled "A Silicon Carbide Deposition For Use As A Barrier Layer And An Etch Stop", filed Oct. 1, 1998, and a continuation-in-part of U.S. Ser. No. 09/219,945, entitled "A Silicon Carbide Deposition For Use as a Low Dielectric Constant Anti-Reflective Coating", filed Dec. 23, 1998, and claims priority to both prior applications.

FIELD OF THE INVENTION

The present invention relates generally to the fabrication of integrated circuits on substrates. More particularly, the invention relates to a low temperature method for producing a low dielectric constant (low κ) silicon carbide film utilizing organosilane precursors under certain process regimes, which is useful as a low κ barrier layer, an etch stop, and an anti-reflective coating, and especially for in situ deposition with a plurality of layers, including dielectric layers.

BACKGROUND OF THE INVENTION

Consistent and fairly predictable improvement in integrated circuit design and fabrication has been observed in the last decade. One key to successful improvements is the multilevel interconnect technology, which provides the conductive paths between the devices of an integrated circuit (IC) device. The shrinking dimensions of features, presently in the subquarter micron and smaller range, such as horizontal interconnects (typically referred to as lines) and vertical interconnects (typically referred to as contacts or vias; contacts extend to a device on the underlying substrate, while vias extend to an underlying metal layer, such as M1, M2, etc.) in very large scale integration (VLSI) and ultra large scale integration (ULSI) technology, has increased the importance of reducing the dielectric constant of the many layers and the capacitive coupling between interconnect lines. In order to further improve the speed of integrated circuits, it has become necessary to use materials having low resistivity and low κ (dielectric constant less than 7.0) insulators to reduce the capacitive coupling between adjacent metal lines. The need for low κ materials extends to barrier layers, etch stops, and anti-reflective coatings used in photolithography. However, typical barrier layer, etch stop, and anti-reflective coating materials have dielectric constants that are significantly greater than 7.0 that result in a combined insulator that does not significantly reduce the dielectric constant. Thus, better materials are needed for barrier layers, etch stops, and anti-reflective coatings having low κ values. The need for low κ materials also extends to dielectric layers. For instance, present efforts seek to establish a dielectric constant value for the dielectric layer(s) to less than 3.0 and preferably less than 2.5.

With the increase in circuit density, additional process changes are needed for smaller feature sizes. For instance, efforts are being made to improve the photolithography processes for more precise pattern etching. Photolithography is a technique used in making integrated circuits that uses light patterns and photoresist materials (typically organic polymers) to develop fine-scaled patterns on a substrate surface. Photoresist materials typically include, for example, naphthoquinone diazides. In many instances, to properly process the substrate with photolithography and avoid unwanted patterning, the high reflectivity of the layer to be patterned must be ameliorated so light ray reflection is reduced. Reflectivity is usually expressed as a percentage of a known standard, such as bare silicon, having a value of 100%. Extraneous reflections from underlying layers can be reflected to the photoresist and expose the photoresist in undesired areas. Any unwanted exposure can distort the lines, vias, and other features intended to be formed. The reflectivity of damascene structures, discussed below, has increased the need for better photolithography processes.

With multi-layer structures, increased reflectivity has contributed to imprecise etching. Dielectric layers are naturally translucent to the ultraviolet light used to expose the photoresist. Thus, multi-level dielectrics and features in the damascene structures results in increased and unwanted reflections. As a result, an anti-reflective coating (ARC) is deposited over the layer to be etched, where the ARC is typically a thin sacrificial layer that has a lower reflectivity than the underlying layer and is etched by the same or similar chemistries that are used to etch the underlying layer. The ARC reduces or eliminates the extraneous reflections so that improved feature dimensions and accuracy can be more closely spaced, enabling the increased current density desired for ULSI circuits.

ARC materials can be organic or inorganic, as described in U.S. Pat. No. 5,710,067, which is incorporated by reference herein. Organic ARCs include spin-on polyimides and polysulfones, among other materials, and are generally more expensive and require more complex processing than inorganic ARCs. Inorganic ARCs include silicon nitride, silicon oxynitride, α-carbon, titanium nitride, silicon carbide, and amorphous silicon. Prior to the present invention, inorganic ARCs typically were characterized by a high κ value and were not compatible with low κ structures. Use of a high κ ARC partially negates the advantage of using low κ materials because it adds a high κ material to a stack of otherwise low κ layers. In some applications, the high κ ARC can be removed from the substrate, but the removal adds complexity to the processing sequence. Organic ARCs can be used, but they are generally more expensive and require additional processing.

FIG. 1 shows a representation of a typical substrate with a positive photoresist deposited over a dielectric, as part of the photolithography processing. A positive photoresist develops in the areas exposed to light, whereas a negative photoresist develops in the areas which are not exposed to light. The integrated circuit 10 includes an underlying substrate 12 having a feature 11, such as a contact, via, line, or trench formed thereon. The term "substrate" as used herein can indicate an underlying material, and can be used to represent a series of underlying layers below the layer in question, such as an etch stop or barrier layer. A barrier layer 13 may be deposited over the substrate, followed by a dielectric layer 14. The dielectric layer may be un-doped silicon dioxide also known as un-doped silicon glass (USG), fluorine-doped silicon glass (FSG), or some other low κ material. In this example, an ARC 15 is deposited over the dielectric layer, followed by a photoresist layer 19.

The purpose of the ARC is to reduce or eliminate any reflected light waves, typically, by adjusting three aspects of the ARC material—a refraction index (n), an absorption index (k, distinguished from the "κ" of a "low κ" dielectric), and the thickness (t) of the ARC to create a phase cancellation and absorption of reflected light. Typically, the required n, k, and t values depend on the thickness and properties of the underlying layer and need adjustment for each particular application. A computer simulation program, such as one entitled "The Positive/Negative Resist Optical Lithography Model", PROLITH/2, v. 4.05, available from Finle Technologies of Austin, Tex., simulates the effect on the n, k, and t values and the reflectivity of the particular layers. The results are analyzed and are typically followed by actual testing and reviewing the results through scanning electron microscopy (SEM) techniques. A proper combination at the various values of n, k, and t is chosen to reduce the reflected light for that application. Because the values of n, k, and t are dependent on each application and each substrate thickness, the proper selection may be time consuming and onerous. In addition, the selection of the n, k, and t values may be only applicable to narrow thickness ranges of the underlying layers which may cause additional difficulties in the repeatability of the deposition process from substrate to substrate.

FIG. 2 is a schematic of the photolithography process in which a light source 23 emits light, such as ultraviolet light, through a patterned template or mask 21 that defines the pattern of light that will be projected onto the photoresist layer 19, ultimately resulting in a patterned substrate. The light typically causes the photoresist in the exposed area 25 to change its solubility to organic solvents. Thus, the exposed areas can be removed by soaking or otherwise cleaning the exposed areas while retaining the unexposed areas.

FIG. 3 is a schematic of the substrate with the feature 27 formed thereon using the etching process. The remainder of the photoresist has been removed, the feature has been etched to the appropriate level, and the substrate is prepared for a subsequent process such as the deposition of a liner, conductor, or other layer(s).

Traditional deposition/etch processes for forming interconnects has also been improved with the higher circuit density to obtain more precise pattern etching. Thus, new processes are being developed. For instance, the traditional method of forming the circuit was depositing blanket layers of a conductor, etching the conductor to pattern the features, and then depositing dielectric materials over and between the features. With the emphasis on increased circuit density, the process has been somewhat reversed by depositing dielectric layers, etching the dielectric layers to form the features, and filling the features with conductive material to form the vias, lines, and other features.

The current trend in metallization is to use a damascene structure. In a dual damascene structure, the dielectric layer is etched to define both the contacts/vias and the interconnect lines in multi-layered substrates. Metal is then inlaid into the defined pattern and any excess metal is removed from the top of the structure in a planarization process, such as chemical mechanical polishing (CMP).

The reflectivity of such multilevel structures as a damascene structure has raised the required level of performance of ARC materials. Prior to such structures, the layer to be etched was typically above a single metal layer which is not transparent to the light exposure. Thus, the unwanted photoresist exposure from underlying layers was substantially limited to the single metal layer under the photoresist. However, in damascene and other structures, an increased number of layers above the conductor layer are now used with multilevel patterning. The dielectric layer(s) and other layers beside the conductor layers in features are comparatively transparent to the exposure light and thus more levels of reflections from multiple levels of features can hinder the photolithography processing of the upper layer. For instance, lines and vias/contacts may appear in the substrate at different levels. Light reflected from the different features at different levels result in reflected light patterns back to the photoresist layer which, unless corrected, may cause unwanted exposure of the photoresist.

Thus, with the decreasing feature sizes, the emphasis on low κ stacks, the use of copper, and the complex dual damascene structures, new methods and materials are needed to provide improved ARC characteristics. Silicon nitride and oxynitride have been typical materials used for an ARC, but have a relatively high dielectric constant (dielectric constant greater than 7.0) and may significantly increase the capacitive coupling between interconnect lines. The capacitive coupling may lead to cross talk and/or resistance-capacitance (RC) delay, i.e., the time required to dissipate stored energy, that degrades the overall performance of the device.

In searching for new materials, others have recognized some potential in silicon carbide (SiC) for some applications. But to the knowledge of the inventor, no source has adequately sought and developed a suitable ARC, barrier layer, and etch stop, using SiC. Furthermore, no known source has found a suitable combination of chemistries that allows in situ deposition, for instance, in the same chamber, of low κ dielectric layers, and SiC barrier layers, etch stops, and ARCs. Some sources, including U.S. Pat. No. 5,710,067 to Foote, et al., above, have noted or suggested silicon carbide in some form as an ARC. To the knowledge of the inventor, silicon carbide that has been produced using these traditional methods has not been effective in meeting the new process requirements in low κ structures. For instance, the disclosed chemistry of U.S. Pat. No. 5,591,566 to Ogawa, which patent is incorporated herein by reference, uses separate sources of silicon, carbon, and hydrogen. This more traditional approach results in a higher κ than is desirable for the low κ emphasis of the ULSI efforts, especially in damascene structures. Another example, disclosed in U.S. Pat. No. 5,360,491 to Carey, et al., which is also incorporated herein by reference, requires a conversion to a crystalline silicon carbide, denoted as β-SiC.

Another reference referring to SiC is U.S. Pat. No. 4,532,150 to Endo et al., which is incorporated herein by reference and refers to a specific formulation of $Si_xC_{1-x}$, in which x is a positive number of 0.2 to 0.9 for providing SiC to a substrate surface. Endo provides no disclosure of SiC as a barrier layer, etch stop, or ARC, and the process parameters given in its examples are below the preferred or most preferred parameters of the present invention.

U.S. Pat. No. 5,465,680 to Loboda, incorporated herein by reference, discloses a SiC film in a CVD chamber, but fails to produce the film at low temperatures less than about 600° C. Another Loboda reference, U.S. Pat. No. 5,818,071, also incorporated herein by reference, discloses a SiC film for use as a barrier layer with a low κ dielectric layer, but fails to disclose that the SiC itself may be a low κ material and fails to describe regimes that would produce a low κ SiC. To the inventor's knowledge, a low κ SiC has eluded those in the field until the present invention. Furthermore, the Loboda '071 reference is designed to accommodate a subtractive deposition, not a damascene deposition as current technology uses, in which the substrate deposition deposits the metal layer, then etches the metal and deposits the SiC into the etched metal layer, resulting in a much different structure than a damascene structure.

Another reference, U.S. Pat. No. 5,238,866 to Bolz, et al., also incorporated herein by reference, uses methane, silane, and phosphine to create a hydrogenated silicon carbide coating for use in the medical field, having an improved compatibility with blood. However, none of these references contain a disclosure for SiC with the following process regimes used as a barrier layer, etch stop, or a low κ ARC.

The increasing complexities of the circuitry have also added to the processing steps. Transfers between chambers to effect the processing slow the production process and increase a likelihood of contamination. Thus, the processing would benefit by reducing the transfers outside of an enclosed cluster of chambers or even reducing the transfers out of the processing chamber itself by performing in situ processing on multiple layers. Preferably, the processing would include the same or similar precursors used for the multiple layers, such as the barrier layer(s), etch stop(s), ARC(s), and dielectric layer(s).

Therefore, there is a need for an improved process using silicon carbide as a low κ barrier layer, an etch stop, and an ARC for ICs, especially in a damascene structure and to deposit the layers in situ with each other and with associated dielectric layers.

SUMMARY OF THE INVENTION

The present invention provides a SiC material, formed according to certain process regimes, useful as a barrier layer, etch stop, and/or an ARC, in multiple levels, including the pre-metal dielectric (PMD) level, in IC applications and provides a dielectric layer deposited in situ with the SiC material for the barrier layers, etch stops, and ARCs. Preferably, the chamber is configured to deliver the same or similar precursors for the barrier layers, etch stops, ARCs, and dielectric layers. However, the dielectric layer(s) can be deposited with different precursors. The present invention is particularly useful for ICs using high diffusion copper as a conductive material. The invention may also utilize a plasma containing a reducing agent, such as ammonia, to reduce any oxides that may occur, particularly on metal surfaces such as copper filled features. The invention also provides processing regimes that include using an organosilane as a silicon and carbon source, perhaps independently of any other carbon source or hydrogen source, and preferably in the absence of a substantial amount of oxygen to produce a SiC with a dielectric constant of less than 7.0. This particular SiC material is useful in complex structures, such as a damascene structure and is conducive to in situ deposition, especially when used in multiple capacities for the different layers, such as the barrier layer, the etch stop, and the ARC and can include in situ deposition of the associated dielectric layer(s).

A preferred process sequence for forming a silicon carbide layer on a substrate, comprises introducing silicon, carbon, and a noble gas into a chamber, initiating a plasma in the chamber, reacting the silicon and the carbon in the presence of the plasma to form silicon carbide, depositing a silicon carbide layer having a dielectric constant less than 7.0 on the substrate in the chamber, and depositing a first dielectric layer in situ with the silicon carbide layer.

Another aspect of the invention comprises in situ deposition of silicon carbide on a substrate, including depositing a silicon carbide barrier layer on the substrate, depositing a first dielectric layer on the barrier layer in situ with the barrier layer, depositing an etch stop on the first dielectric layer in situ with the first dielectric layer, depositing a second dielectric layer on the etch stop in situ with the etch stop, and depositing an anti-reflective coating on the second dielectric layer in situ with the second dielectric layer.

Another aspect of the invention includes a substrate having a silicon carbide layer having a dielectric constant less than 7.0 and deposited on the substrate and a first dielectric layer deposited on the silicon carbide layer in situ with the silicon carbide layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention provides a SiC material, formed according to certain process regimes, useful as a barrier layer, etch stop, and/or an ARC, in multiple levels, including the pre-metal dielectric (PMD) level, in IC applications and provides a dielectric layer deposited in situ with the SiC material for the barrier layers, and etch stops, and ARCs. The dielectric layer can be deposited with different precursors as the SiC material, but preferably with the same or similar precursors as the SiC material. The present invention is particularly useful for ICs using high diffusion copper as a conductive material. The invention may also utilize a plasma containing a reducing agent, such as ammonia, to reduce any oxides that may occur, particularly on metal surfaces such as copper filled features. The invention also provides processing regimes that include using an organosilane as a silicon and carbon source, perhaps independently of any other carbon source or hydrogen source, and preferably in the absence of a substantial amount of oxygen to produce a SiC with a dielectric constant of less than 7.0. This particular SiC material is useful in complex structures, such as a damascene structure and is conducive to in situ deposition, especially when used in multiple capacities for the different layers, such as the barrier layer, the etch stop, and the ARC and can include in situ deposition of the associated dielectric layer(s).

As described below, a desirable characteristic includes depositing the material in situ, i.e., preferably in a given chamber, such as in a plasma chamber, or in a system, such as an integrated cluster tool arrangement, without exposing the material to intermediate contamination environments. In situ processing may be particularly important with a copper conductor, because of its rapid susceptibility to oxidation. By using the same or similar precursors, described below to create the SiC material, with different process regimes and reacting with oxygen, different materials may be created, such as a low κ dielectric material. The possibilities of in situ deposition of the various layers in a processing chamber or chambers are enhanced using the present invention. For instance, the barrier layer, lower dielectric layer, etch stop, upper dielectric layer, ARC, and other layers can be deposited within one chamber using different process regimes to obtain the different materials.

Figure 4:
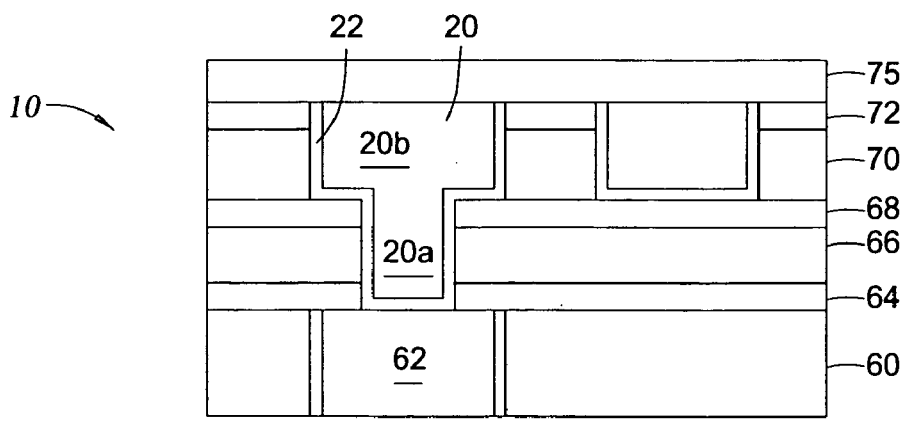
FIG. 4 is a schematic of a damascene structure using the SiC of the present invention as a barrier layer, an etch stop, and an ARC with an in situ deposition of the dielectric layers.

FIG. 4 shows a preferred embodiment of a dual damascene structure, utilizing the present invention. Specifically, the structure includes a deposition of one or more dielectric layer(s), and SiC barrier layer(s), etch stop(s), and ARCs deposited in situ to produce the SiC of the present invention and the dielectric layers. The dielectric layers can be deposited with the same or similar precursors as the SiC material or can be deposited with different precursors. The embodiment also utilizes a plasma containing a reducing agent, such as ammonia, to reduce any oxides that may occur, particularly on metal surfaces such as copper deposited in features.

At least two schemes can be used to develop a dual damascene structure, where lines/trenches are filled concurrently with vias/contacts. In a "counterbore" scheme, the IC is formed, for instance, by depositing a barrier layer, first dielectric layer, etch stop, second dielectric layer, ARC, and photoresist where the substrate is then etched. In FIG. 4, the integrated circuit 10 includes an underlying substrate 60, which may include a series of layers deposited thereon and in which a feature 62 has been formed. If a conductor is deposited over the feature 62, such as copper, the conductor may oxidize. In situ with the deposition of the various layers, the oxide can be exposed to a plasma containing a reducing agent of nitrogen and hydrogen, such as ammonia, to reduce the oxide. One embodiment is described in co-pending U.S. Ser. No. 09/193,920, incorporated herein by reference, which describes plasma process parameters using an ammonia flow rate of about 100 to 1000 sccm with a chamber pressure range of about 1 to 9 Torr, an RF power of about 100 to 1000 watts for a 200 mm wafer, and a showerhead to substrate spacing of about 200 to 600 mils.

Figure 1:
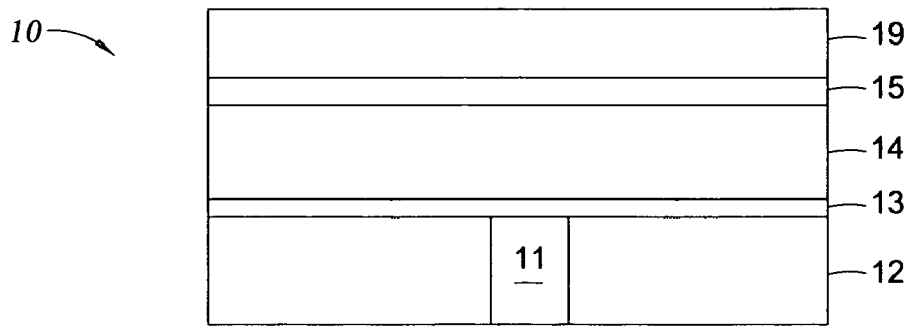
FIG. 1 is a schematic of photoresist material on an ARC in a substrate.
Figure 2:
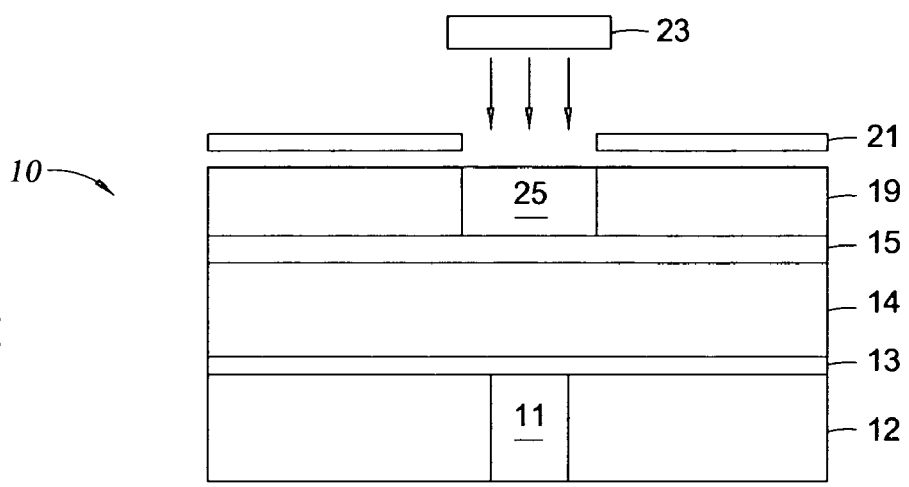
FIG. 2 is a schematic of a light exposing the photoresist of FIG. 1.
Figure 3:
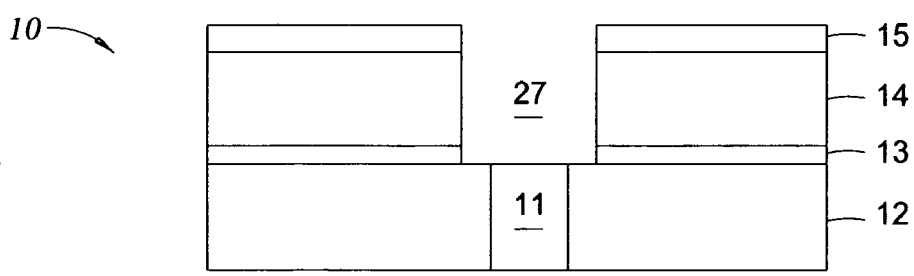
FIG. 3 is a schematic of the substrate of FIGS. 1 and 2, etched and prepared for subsequent deposition in the feature.

The SiC of the present invention can be deposited in situ as a barrier layer, an etch stop, and an ARC with the in situ deposition including the dielectric layers. For instance, a SiC barrier layer 64, preferably about 500 Å thick, is deposited over the substrate and feature. Without the necessity of removing the substrate, a dielectric layer 66 may be in situ deposited over the barrier layer 64, preferably about 5000 Å thick. Preferably, the dielectric layer is an oxide based dielectric material having low κ characteristics. The dielectric layer may be un-doped silicon dioxide also known as un-doped silicon glass (USG), fluorine-doped silicon glass (FSG), or other silicon-carbon-oxygen based materials, some of which can be low κ materials. A low κ etch stop 68, also of SiC material according to the present invention, is then in situ deposited on the dielectric layer 66 to a thickness of about 200 Å to about 1000 Å, preferably about 500 Å. The etch stop material is typically a material that has a slower etching rate compared to the dielectric layer that is etched and allows some flexibility in the etching process to ensure that a predetermined depth is reached. In some well characterized etching processes, the etch stop may be unnecessary. Another dielectric layer 70 is deposited over etch stop 68, having a thickness from about 5,000 Å to about 10,000 Å, preferably about 7000 Å. Dielectric layer 70 can be the same material as dielectric layer 66. Likewise, the dielectric layer 70 can be deposited in situ with the barrier layer 64, dielectric layer 66, and etch stop 68. An ARC 72, also of SiC material and preferably about 600 Å thick, is deposited on the dielectric layer 70, using the same or similar chemistry as the underlying etch stop and barrier layer. After the ARC deposition, a photoresist layer (not shown), similar to photoresist layer 19 shown in FIG. 1, is deposited on the ARC 72. Depositing and exposing of the photoresist and etching would normally be accomplished in other chambers. The photoresist layer is exposed to form a pattern for the via/contact 20*a*, using conventional photolithography. The layers are then etched using conventional etch processes, typically using fluorine, carbon, and oxygen ions to form the via/contact 20*a*. The photoresist layer is subsequently removed. Another photoresist layer is deposited and exposed to pattern the features, such a line/trench 20*b* and the layer(s) are etched to form the line/trench 20*b*. The photoresist layer is subsequently removed. A liner 22 may be needed over the features or on the fields between the features, which typically is from Ta, TaN, Ti, TiN, and other materials. A conductive material 20, such as copper or aluminum, is then deposited simultaneously in both the via/contact 20*a* and the line/trench 20*b*. Once the conductive material 20 is deposited over the feature(s), it too may be exposed to a plasma containing a reducing agent, such as ammonia, to reduce any oxides. Another SiC barrier layer 75 may be deposited over the conductive material 20 to help prevent diffusion of the conductor through subsequent layers.

Another scheme for creating a dual damascene structure is known as a "self-aligning contact" (SAC) scheme. The SAC scheme is similar to the counterbore scheme, except that a photoresist layer is deposited over the etch stop, the etch stop is etched and the photoresist is removed. Then the subsequent layers, such as another dielectric layer, are deposited over the patterned etch stop, an ARC deposited over the dielectric layer, and a second photoresist layer deposited over the ARC, where the stack is again etched. In the embodiment of FIG. 4, for instance, a photoresist layer (not shown) is deposited over the etch stop 68, in typically a separate chamber from the etch stop deposition. The etch stop 68 is etched to form a pattern for a via/contact 20a. The photoresist layer is removed. The dielectric layer 70 and ARC 72 can then be in situ deposited in the same chamber as the etch stop was deposited. Another photoresist layer is deposited on the ARC 72. The photoresist is then exposed to form the pattern for the line/trench 20b. The line/trench 20b and the via/contact 20a are then etched simultaneously. The photoresist layer is subsequently removed. Conductive material 20, and if desired, another barrier layer 75, are deposited over the substrate.

The in situ processing is enhanced because of the reduced number of different materials and regimes and, in particular, because the SiC can be used as the barrier layer, etch stop, ARC layer, and even as a passivation layer and moisture barrier. The in situ processing is further enhanced in the preferred embodiment by using the same or similar precursors to deposit the dielectric layers. Reducing or eliminating the need to remove the substrate from the processing chamber between depositing the layers for chamber cleanings and the like improves throughput, reduces downtime, and reduces the risk of contamination.

In some instances, the etching may be performed in the same chamber by adjusting the process conditions. However, in many instances, the substrate may be moved to an etching chamber. In such instances, the processing may be performed within a cluster tool having both a deposition chamber and an etch chamber, such as the cluster tool shown in U.S. Pat. No. 4,951,601, assigned to the current assignee of the invention, and incorporated herein by reference. The sealable cluster tool enables processing within the cluster tool to occur without unnecessary exposure to the ambient conditions. However, where possible a preferred arrangement enables processing within same chamber to reduce the transfer time between chambers for greater throughput.

Furthermore, in situ processing provides accurate control over the rate of transition between the deposited layer and the preceding layer. The transition between the two layers is controlled by the transition between the chemistries and the related process parameters used to deposit the layers. The method of the present invention enables accurate control over the transition via control over the plasma, process gas flow rates, and other processing parameters. The transition may be abrupt and can be achieved, for example, by extinguishing the plasma followed by the deposition of the dielectric layers and the various SiC layers while the substrate remains in the chamber. Gradual transitions can also be achieved, for example, by altering the flow rates of the process gases. In a process which deposits a FSG dielectric layer, the flow rate of silicon tetrafluoride, commonly used for a FSG deposition, may be reduced while increasing the helium or argon flow to create a smooth transition from the dielectric layer to the SiC layer. The flexibility in the transition is made possible by the ability to deposit multiple layers in situ.

The above discussion refers to an exemplary sequence and is not to be construed as limited to such sequence, as such in situ processing could be applied to a variety of sequences. Also, these structures are exemplary for a dual damascene structure and are not intended to be limiting of the possible embodiments.

Because the SiC, as explained below, may be used in multiple capacities, Table 1 shows the desirable aspects of at least three of the uses of the SiC of the present invention as a barrier layer, an etch stop, and an ARC.

TABLE 1

DESIRABLE CHARACTERISTICS OF BARRIER/ETCH STOP/ARC

| | |
|---|---|
| Anti-Reflective Coating Indexes n, k | Multi-application suitability |
| | Multi-purpose use |
| | Low κ retained for particular n, k |
| | Stable and repeatable |
| | Elimination of undesired reflections |
| | Multiple photolithography uses |
| Good Barrier Property to Copper | Good Adhesion |
| | No Copper Diffusion at 400°–450° C. Annealing Stage |
| High Etch Selectivity with respect to USG/FSG/Other Low κ Dielectric Materials | Etch Stop > 20:1 |
| Lower Dielectric Constant | Overall Reduction in Effective Dielectric Constant ($K_{eff}$) in IMD Damascene Stacks |
| Good Electrical Properties | High Breakdown Voltage |
| | Low Leakage |
| Productivity/Manufacturability | Process Stability and Particle Control |
| | In-situ Process for Throughput Improvement, e.g., USG Deposition with Etch Stop Layer Deposition |

As stated earlier, a low κ material is defined herein as a material having a dielectric constant lower than 7.0 which is lower than that of silicon nitride, traditionally used as a barrier layer material. Related to the low dielectric value is the "effective" dielectric constant, which is a composite dielectric constant of the stack with multiple levels. The effective dielectric constant is based on such factors as the layer thicknesses, layer dielectric constants, spacing between features and feature dimensions. Commercially available software, such as "Rafael" by Avant Corporation may be used to calculate the predicted effective dielectric constant. For instance, a typical value of a low κ dielectric layer is about 2.7. A SiN layer may have a κ value of at least 7.0. Using the SiN material with the low κ dielectric material would increase the effective κ value of the composite and offset some of the advantage of using the low κ dielectric material. In comparison, using the SiC of the present invention with a κ value of less than 5, preferably about 4.2, allows more benefit from using low κ dielectric material to be obtained. A desirable effective dielectric constant value for the composite structure would be about 5.0 or less, most preferably 3.0 or less.

If the SiC is used as an ARC, desirable characteristics would include the low κ aspect described above as well as a suitable refraction index "n" combined with an absorption index "k" and a thickness "t" of the ARC to obtain a low reflectivity below about 5%, although other values may be selected, so that the coating could be used in multiple applications without necessitating process regime adjustments and variations for each application, as is typically needed, prior to the present invention. The process to produce the SiC should be stable and repeatable for manufacturing consistency.

Because the ARC may remain on the substrate because of its low κ attributes, it may also function as a barrier layer between, for instance, an underlying dielectric and a conductor material, such as copper. Adhesion between the layers is important to reduce delamination between the layers and, in some instances, to reduce capacitance and resistance between the layers. When the ARC is used as a barrier layer, the material should also have no substantial diffusion at a substrate annealing temperature of, for example, about 400° to 450° C. The term "no substantial" diffusion is intended to be a functional term, such that any actual diffusion into the layer is less than would affect the ability of the layer to function as a barrier layer and/or etch stop. For instance, the SiC of the present invention limits the diffusion to about 250 Å. The copper diffusion may impair the desired current and voltage paths and contribute to cross talk. Because of the decreasing feature size, as described above, the lower the dielectric constant, preferably less than 7.0, the lower the probability for cross talk and RC delay.

Because the SiC may be used in a damascene structure and function as a multi-purpose barrier layer, ARC, and etch stop as discussed in one embodiment, it would be beneficial to also have suitable etch stop characteristics, such as an etch selectivity ratio of 20 to 1 or greater with respect to USG, FSG, or other low κ dielectric materials. Additionally, the material should have a high breakdown voltage of 2 MV or more, i.e., the voltage gradient at which the molecules breakdown to allow harmful passage of electrical current. The SiC should also have a low leakage characteristic through the layer, i.e., a low stray direct current that capacitively flows through the material.

Table 2 shows the process parameters used to form the SiC layer of the present invention in a 200 mm wafer deposition reactor. In a preferred embodiment, the silicon and carbon were derived from a common compound, such as a silane-based compound. However, the carbon could be supplemented with other compounds, such as methane. Without limitation, suitable silane-based compounds could include: methylsilane ($CH_3SiH_3$), dimethysilane ($(CH_3)_2SiH_2$), trimethylsilane ($(CH_3)_3SiH$), diethylsilane ($(C_2H_5)_2SiH_2$), propylsilane ($C_3H_8SiH_3$), vinyl methyl-silane ($CH_2=CH)CH_3SiH_2$), 1,1,2,2-tetramethyl disilane (HSi$(CH_3)_2$—Si$(CH_3)_2$H), hexamethyl disilane ($(CH_3)_3Si$—Si$(CH_3)_3$), 1,1,2,2,3,3-hexamethyl trisilane (H$(CH_3)_2Si$—Si$(CH_3)_2$—SiH$(CH_3)_2$), 1,1,2,3,3-pentamethyl trisilane (H$(CH_3)_2Si$—SiH$(CH_3)$—SiH$(CH_3)_2$), dimethyl disilano ethane ($CH_3$—SiH$_2$—$(CH_2)_2$—SiH$_2$—$CH_3$), dimethyl disilano propane ($CH_3$—SiH—$(CH_2)_3$—SiH—$CH_3$), tetramethyl disilano ethane (($CH)_2$—SiH—$(CH_2)_2$—SiH—$(CH)_2$), tetramethyl disilano propane (($CH_3)_2$—Si—$(CH_2)_3$—Si—$(CH_3)_2$), and other silane related compounds. For the purposes of this invention, the term "organosilane" as used herein includes any silane-based compound having at least one carbon atom attached, including the preceding list, unless otherwise indicated. A preferred organosilane is given by the structure $SiH_n(CH_3)_{4-n}$, where n=1 to 3 or the structure $Si_2H_m(CH_3)_{6-m}$, where m=1 to 5. In Table 2, the compounds used were trimethylsilane and methylsilane. A noble gas, such as helium or argon, was present and is believed to assist in stabilizing the process, although other gases could be used.

The process regimes described below provide a SiC material that meets at least some of the characteristics of Table 1 of a barrier layer, etch stop, and/or an ARC. Also, the SiC properties described herein enable a thinner layer to be deposited to achieve desirable film properties. In one embodiment, shown in FIG. 4, the SiC, as an upper layer ARC, allows a diverse range of underlying dielectric thicknesses without needing to adjust the SiC ARC thickness, typical of prior efforts in the field. The SiC material of the present invention has a high resistance to copper diffusion with test data showing that the copper diffusion limit is about 200 to 250 Å deep in the barrier layer. In another embodiment shown in FIG. 12, the SiC material provides a combination low κ etch stop/ARC without using the upper layer ARC in FIG. 4. In another embodiment shown in FIG. 15, the barrier layer below the dielectric layer functions as the ARC.

TABLE 2

| Parameter | Range | Preferred | Most Pref. |
|---|---|---|---|
| Silicon and Carbon (3 MS or MS–sccm) | 10–1000 | 30–500 | 50–200 |
| Noble (He or Ar–sccm) | 50–5000 | 100–2000 | 200–1000 |
| Press. (Torr) | 1–12 | 3–10 | 6–10 |
| RF Power (Watts) | 100–1000 | 300–700 | 400–600 |
| Power Density (Watts/"in$^2$") | 0.7–14.3 | 4.3–10.0 | 5.7–8.6 |
| Freq. (MHz) | 13.56 | 13.56 | 13.56 |
| Temp. (C.) | 100–450 | 200–400 | 300–400 |
| Spacing (Mils) | 200–600 | 300–600 | 300–500 |

Example Process-Barrier Layer/Etch Stop/ARC

The characteristics developed by the above process regimes differ from the generally accepted SiC characteristics. A SiC film according to the present invention was deposited in a DxZ chamber available from Applied Materials, Inc. of Santa Clara, Calif. A reactive gas source such as trimethylsilane was flown into the chamber at a rate of about 30 to 500 standard cubic centimeters (sccm), more preferably about 50 to 200 sccm. A noble gas, such as helium or argon, was flown into the chamber at a rate of about 100 to 2000 sccm, more preferably about 200 to 1000 sccm. The chamber pressure was maintained between about 3 to 10 Torr, more preferably about 6 to 10 Torr. A single 13.56 MHz RF power source applied about 300 to 700 watts with a power density of about 4.3 to 10 watts/in$^2$, more preferably about 400 to 600 watts with a power density of about 5.7 to 8.6 watts/in$^2$ to the anode and cathode to form the plasma in the chamber with the silane-based gas. The RF power source may be a mixed-frequency RF power supply that typically supplies power at a higher RF frequency of 13.56 MHz and at a lower RF frequency of 360 kHz to enhance decomposition of the reactive species introduced into the chamber. The substrate surface temperature was maintained between about 200° to 400° C., more preferably about 300° to 400° C., during the deposition of the SiC. The gas dispersion from a gas dispersion element, such as a "showerhead", was dispersed at a showerhead to substrate spacing distance between about 300 to 600 mils, more preferably 300 to 500 mils. The carbon was derived from the trimethylsilane or methylsilane, independent of other carbon sources. The reaction occurred without a substantial source of oxygen introduced into the reaction zone.

Figure 5:
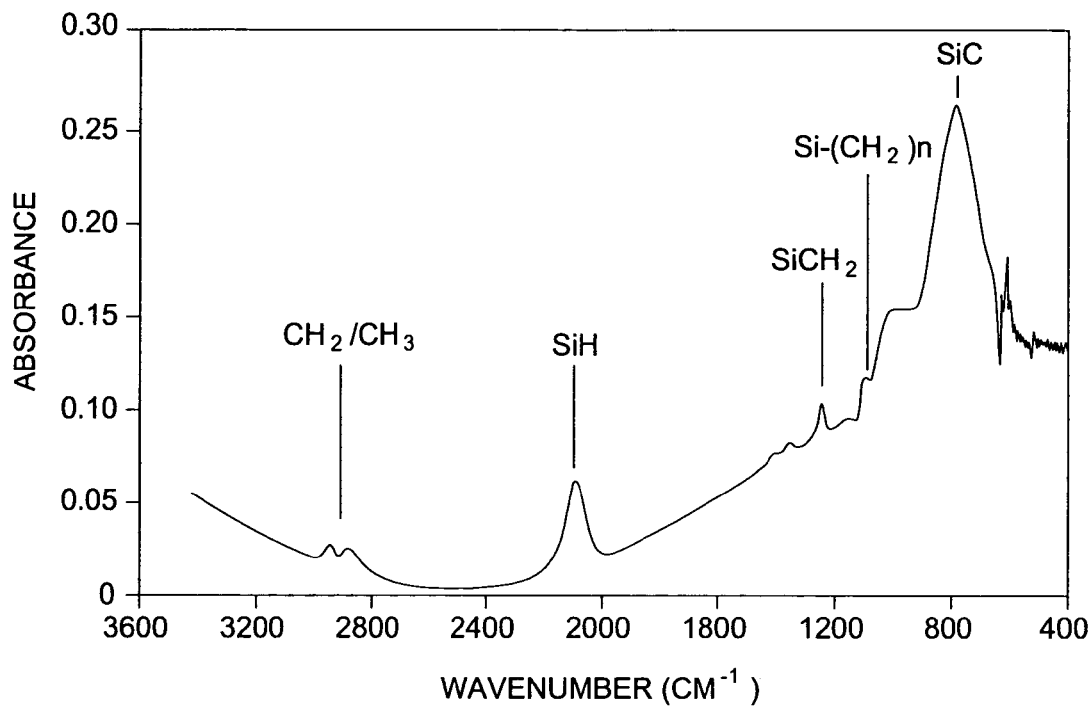
FIG. 5 is a Fourier Transform Infrared (FTIR) chart of the SiC of the present invention, indicating a particular bonding structure.
Figure 6:
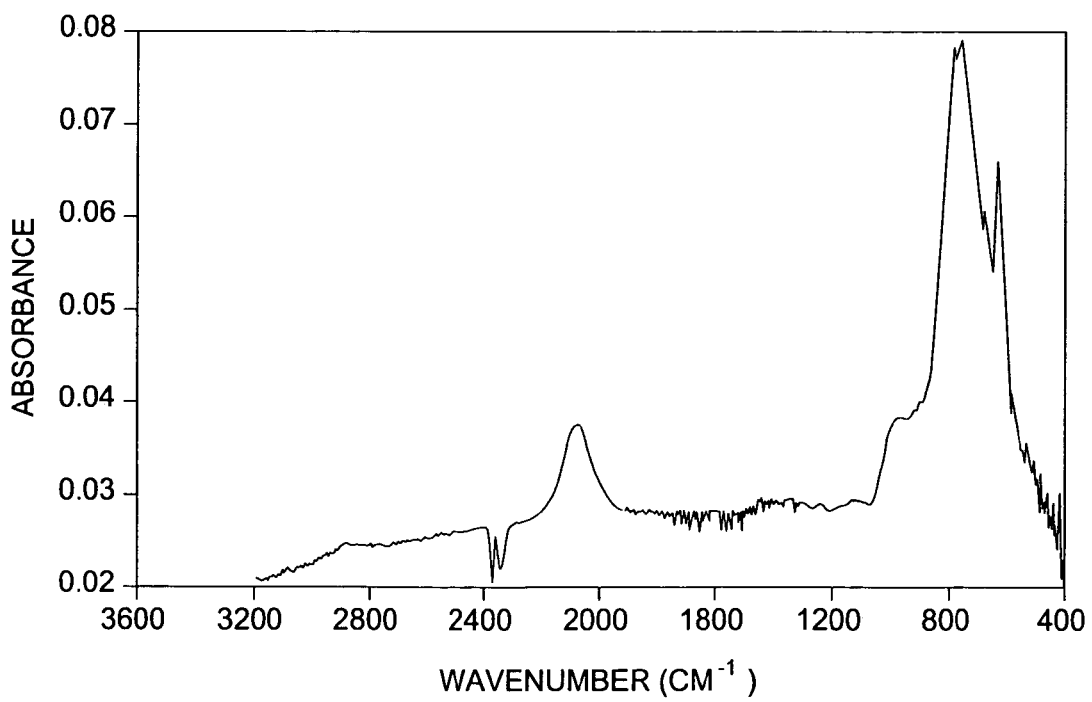
FIG. 6 is a FTIR chart of a previous SiC, indicating a bonding structure different than the SiC of the present invention.

With the parameters of Table 2, a different bonding structure occurs in the SiC film of the present invention, shown in FIG. 5, compared to a prior SiC film, shown in FIG. 6. FIG. 5 shows a Fourier Transform Infrared (FTIR) chart for the SiC of the present invention. The various peaks at various wave numbers are structure specific and this graph is indicative of the particular interstitial bonding structure. Using the most preferred range of process parameters of Table 2 with trimethylsilane, the deposition resulted in a bonding structure containing $CH_2/CH_3$, SiH, SiCH$_3$, Si—$(CH_2)_n$, and SiC.

FIG. 6 shows comparative results with a prior SiC material deposited using silane and methane. As can be seen, there is no corresponding peak for Si—(CH$_2$)n and even the peak for SiCH$_3$ is not as noticeable. The SiC of the present invention yielded these unexpected results in providing better barrier layer/etch stop/ARC performance than previous known depositions of SiC. These characteristics allow the SiC to be used in the multiple capacities disclosed herein.

Figure 7:
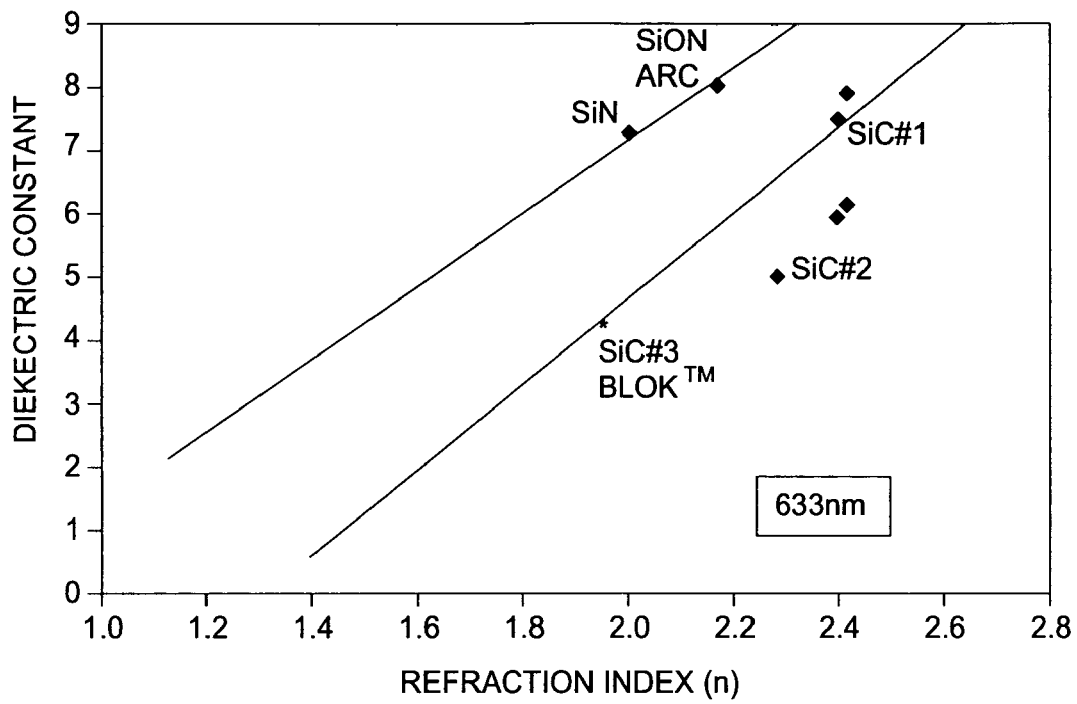
FIG. 7 is a graph of a dielectric constant compared to a refraction index for various materials.

FIGS. 7–19 show various characteristics of the SiC ARC of the present invention. FIG. 7 is a graph of test results, using a standard 633 nm wavelength of exposure light, comparing different materials and their dielectric constants versus the refraction index. The x-axis represents the refraction index, n, discussed above. A lower value on the x-axis is preferred and results in better optical quality and transparency. The y-axis represents the dielectric constant. A lower value on the y-axis is preferred to obtain a "low κ" substrate stack. For instance, SiN typically has an n value of about 2.0 and a dielectric constant value of 7.3, unsuitable for the low κ applications. A current state-of-the-art ARC is DARC™, a type of silicon oxynitride, but the dielectric constant is about 8.5–9.0 with an n value of about 2.2 at a 248 nm wavelength exposure. The preferred SiC of the present invention has a dielectric constant of about 4.2.

The SiC#1 corresponds to test results using the traditional chemistry for producing SiC, described in U.S. Pat. No. 5,591,566 to Ogawa, which uses a silane with a separate methane/ethane/propane and diatomic hydrogen. This SiC has an n value of about 2.4, and a dielectric constant of about 7.8, undesirable for deposition in low κ devices.

SiC#2 is one SiC deposited using the chemistry of the present invention. The n value is about 2.3 and the dielectric constant is about 5.1. Using the parameters described above in Table 2, the SiC#3 produced better optical characteristics, namely, an n value of about 1.9 at the 633 nm exposure wavelength of FIG. 7 with a dielectric constant of about 4.2. Thus, optically and resistively, the SiC of the present invention is suitable for the current emphasis on low κ structures and can be used as a barrier layer, an etch stop, and an ARC. Importantly, the SiC of the present invention, in contrast to the traditional high κ SiC or SiN ARC, need not be removed from the layer after the photoresist has been exposed and the substrate etched in order to preserve the low κ characteristics of the stack, resulting in fewer processing steps.

Figure 8:
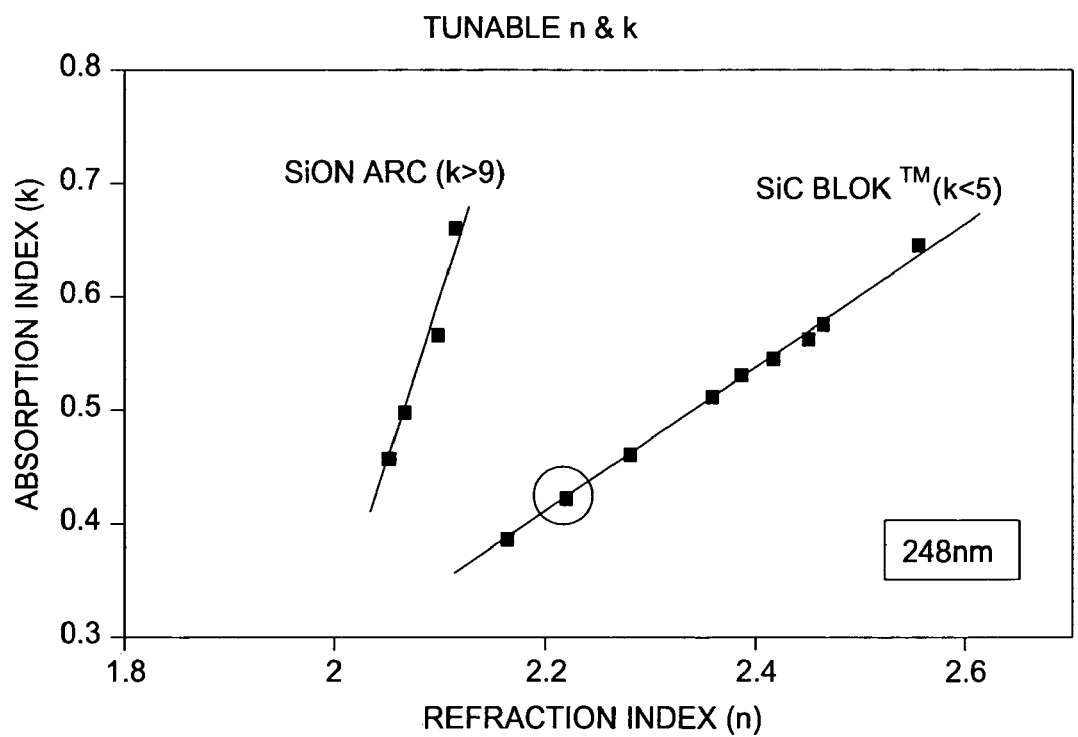
FIG. 8 is a graph of the refraction index compared to the absorption index for two materials, showing that the SiC of the present invention can be tuned to different index values.

FIG. 8 is a graph of the refraction index n compared to the absorption index k for SiC and silicon oxynitride, using a 248 nm exposure wavelength. The SiC of the present invention can be tuned to different n and k values and is compared with a silicon oxynitride ARC. The silicon oxynitride ARC has a high dielectric constant of about 9 and has a difficult to control k value which rapidly increases with a small change in the n value, as shown by the steep slope. By comparison, the SiC of the present invention has a dielectric constant of about 4.5 and a more stable or controllable absorption index k, as indicated by the flatter curve. A higher absorption index is desirable to better absorb the extraneous reflections. However, the dielectric constant increases as the absorption index increases. Thus, there is a balance between the desired optical properties and dielectric constant. A suitable value for the SiC of the present invention, having a relatively low dielectric constant and a stable process regime, is about 2.2 for an n value at the 248 nm exposure wavelength of FIG. 8 and about 0.4 for a k value. The relationship between the n and k indexes at the 248 nm exposure wavelength appears linear and is approximated by the following equation:

$$k/0.65 + 1.57 = n$$

The absorption index k is in a range of between about 0.2 and about 1.0, and generally is between about 0.3 and 1.0 for commercial uses in photolithography. The SiC of the present invention can approximate the optical qualities of the silicon oxynitride ARC and yet reduce the dielectric constant by about 50%. Beginning at the x-axis value in FIG. 8, the slope of line representing the SiC n and k relationship may vary from about 20° to about 60° with the slope of the line shown as about 35°.

The low κ dielectric layer may be produced by PECVD of an organosilane, an organosiloxane, or combinations thereof, using RF or microwave power to generate reactive oxygen atoms. The dielectric material is deposited using the precursors described above, such as methylsilane or trimethylsilane, reacted in the presence of oxygen, such as with nitrous oxide (N$_2$O). Preferably, the process regimes provided in Table 2 could be used to produce the dielectric layer(s). However, other process regimes can be used to form the dielectric materials. In one embodiment, for instance, an organo-silicon compound was oxidized with preferably N$_2$O such that the carbon content of the deposited film is from 1 to 50% by atomic weight, preferably about 5 to 30%. A mixed frequency RF power supply supplied power at a high RF power of 13.56 MHz to a showerhead of a PECVD system and a low RF frequency of about 360 KHz to the pedestal of the system. A pulsed RF power provided 13.56 MHz RF power at about 20 watts to 500 watts during about 10% to 30% of the duty cycle. Using a 200 mm wafer, the power density of the high frequency RF power was preferably less than about 1 watt/in$^2$. The low frequency power is driven at about 0 watts to 50 watts for pulsed RF power at a duty cycle from about 10% to 30%. A constant RF power provided 13.56 MHz RF power at about 10 watts to 200 watts. The organosilane and/or organosiloxane was flown into the PECVD chamber at a flow rate of about 5 sccm to 500 sccm and the oxidizing gas at a flow rate of about 5 sccm to 2000 sccm. The low power deposition occurred at a temperature range from about −20° C. to 40° C. The chamber pressure was a low pressure of less than about 10 Torr. The deposited film was cured at the low pressure and at a temperature of about 100° C. to 450° C. The disclosure of the exemplary low κ dielectric material is described in U.S. Ser. No. 09/162,915, and is incorporated herein by reference.

The organosilane and orqanosiloxane compounds generally include the structures:

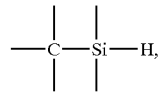

wherein each Si is bonded to one or two carbon atoms and C is included in an organo group, preferably alkyl or alkenyl groups such as —CH$_3$, —CH$_2$—CH$_3$, —CH$_3$—, or —CH$_2$—CH$_2$—, or fluorinated derivatives thereof. The carbon atoms in the fluorinated derivatives may be partially or fully fluorinated to replace hydrogen atoms. When an organosilane or organosiloxane compound includes two or more Si atoms, each Si is separated from another Si by —O—, —C—, —C—C—, wherein C is included in an organo group, preferably alkyl or alkenyl groups such as —$CH_2$—, or —$CH_2$—$CH_2$—, —$CH(CH_3)$—, or —$C(CH_3)_2$—, or fluorinated derivatives thereof. The preferred organosilane and organosiloxane compounds are gases or liquids near room temperature and can be volatilized above about 10 Torr. Preferred organosilanes and organosiloxanes include:

| | |
|---|---|
| methylsilane, | $CH_3$—$SiH_3$ |
| dimethylsilane, | $(CH_3)_2$—$SiH_2$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$—)$_3$— (cyclic) |
| 1,3-dimethyldisiloxane, | $CH_3$—$SiH_2$—O—$SiH_2$—$CH_3$ |
| 1,3-bis(silano-methylene)disiloxane, | $(SiH_3$—$CH_2$—$SiH_2$—$)_2$—O |
| bis(1-methyldisi-loxanyl)methane, | $(CH_3$—$SiH_2$—O—$SiH_2$—$)_2$—$CH_2$ |
| 2,2-bis(1-methyldisi-loxanyl)propane, | $(CH_3$—$SiH_2$—O—$SiH_2$—$)_2$—$C(CH_3)_2$ |
| 2,4,6,8-tetramethyl-cyclotetrasiloxane, and | —(—$SiHCH_3$—O—$)_4$— (cyclic) |
| 2,4,6,8,10-pentamethyl-cyclopentasiloxane, | —(—$SiHCH_3$—O—$)_5$— (cyclic) |
| 1,3,5,7-tetrasilano-2,6-dioxy-4,8-dimethylene, and fluorinated derivatives thereof, such as: | —(—$SiH_2$—$CH_2$—$SiH_2$—O—$)_2$— (cyclic) |
| 1,2-disilanotetrafluoroethylene. | $SiH_3$—$CF_2$—$CF_2$—$SiH_3$ |

The hydrocarbon groups in the organosilanes and organosiloxane may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

Figure 9:
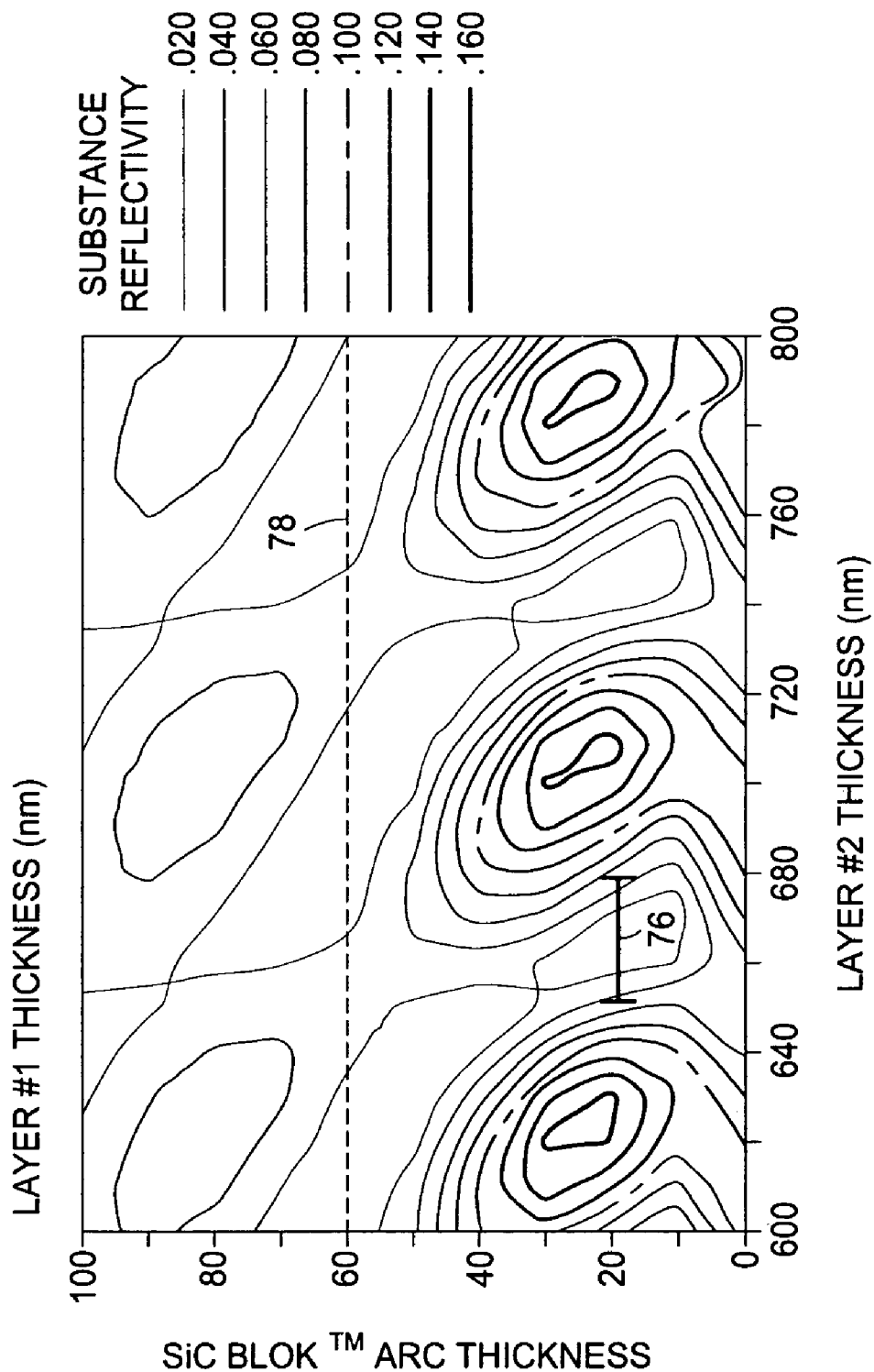
FIG. 9 is a simulation graph of reflectivity contours of the embodiment of FIG. 4.

FIG. 9 is a simulation graph of reflectivity contours depicting reflectivity values of different combinations of layer thicknesses, using a computer simulation program, entitled "The Positive/Negative Resist Optical Lithography Model", referenced above. The simulation graph is used to predict the substrate reflectivity at incremental rates, resulting is a reflectivity topography that maps the effects on reflectivity of the thickness of one layer to the thickness of an adjacent layer. In FIG. 9, each contour is set to increment by 2% with the lowest contour representing a 2% reflectivity and the highest contour representing a 16% reflectivity. In this figure, the x-axis represents the thickness of the underlying layer, i.e., the dielectric layer 70 in FIG. 4. The y-axis represents the SiC thickness used as an ARC, corresponding to the ARC 72 of FIG. 4. The goal of obtaining low reflectivity is to minimize the extraneous reflections from the substrate at the photoresist interface between, in this instance, the photoresist layer and the ARC. An optimal reflectivity value is 0%, but a reflectivity of less than about 7% provides commercially acceptable results with a goal of about 5% or less being preferred to insure repeatability of the photolithography processing. While in some embodiments a 10% reflectivity is acceptable, 10% reflectivity is typically a practical limit to the current size and density of features in the substrate. Thus, if the underlying layer thickness is known and is selected on the x-axis, the corresponding preferred ARC thickness on the y-axis can be predicted by locating an ARC thickness having the chosen reflectivity, such as 5%. For instance, a dielectric thickness of about 6500 Å to about 6750 Å shown as range 76 in FIG. 9, will predictably need about 200 Å of ARC to meet the 5% or less reflectivity criteria. However, such a narrow range of dielectric deposition may be difficult to consistently produce and may not meet device requirements for electrical isolation of the circuit between the layers. Furthermore, the 200 Å layer may be insufficient as a barrier layer to copper if, for instance, copper was deposited on the ARC after etching. Thus, while optically, the ARC layer would be sufficient, other properties, such as described above, may need consideration. In this figure, an ARC thickness of more than about 500 Å results in less than 5% reflectivity across the range of dielectric layer thickness in the graph.

Conversely, if the dielectric layer thickness can be carefully controlled, then the ARC layer thickness can be varied or minimized. For instance, a dielectric thickness of about 6600 Å, plus or minus about 100 Å or about 1.5%, can have an ARC thickness of 50 Å or more and meet the optical parameters of 5% or less reflectivity. Thus, the SiC of the present invention satisfies the desire for a multiple purpose material in providing a barrier layer, etch stop, and an ARC and satisfies the desire for a multiple application material in that a single ARC thickness can meet the optical needs of multiple dielectric thicknesses for a given reflectivity.

In a preferred embodiment, a layer with a preferred thickness of about 600 Å offers one of the lowest reflectivity values across the entire spectrum of the dielectric layer thicknesses, shown as value 78 in the graph. With the unique properties of the SiC of the present invention, an ARC can be deposited that is substantially independent of the underlying layer thickness. The SiC is preferably deposited between about 500 Å to about 1000 Å or more, most preferably about 600 Å, having a predicted reflectivity of about 2% or less, within the preferred 5% or less reflectivity range. This discovery contrasts with the typical need to adjust the n, k, and t characteristics of the ARC layer to the particular thickness of the underlying layer for each application. Here, using the SiC of the present invention, the ARC layer may be a fixed deposition thickness of about 600 Å, independent of the underlying dielectric layer thickness. This fixed thickness contrasts with prior ARC materials which generally require ARC thickness adjustments, depending on the underlying dielectric layer thickness and desired reflectively.

The SiC of the present invention may also be used as a polish stop to determine the end point of a polishing process. After the stack is etched and the features filled with conductive material, some processing sequences polish the upper surface of the substrate surface to remove excess conductive material and planarize the upper surface of the stack. Typically, the substrate is polished by a chemical mechanical polishing (CMP) process, which uses a difference in polishing rates between different materials to determine the limit of polishing.

Because the SiC ARC has a low κ value, the ARC can remain on the substrate and does not need to be removed to maintain an effective low κ substrate. Thus, material may be deposited over the ARC, filling the features. The CMP process then removes any extra conductive or other materials above the SiC layer. The CMP process determines a difference in the polishing rates when the process encounters the SiC ARC and the CMP process is discontinued.

Figure 10:
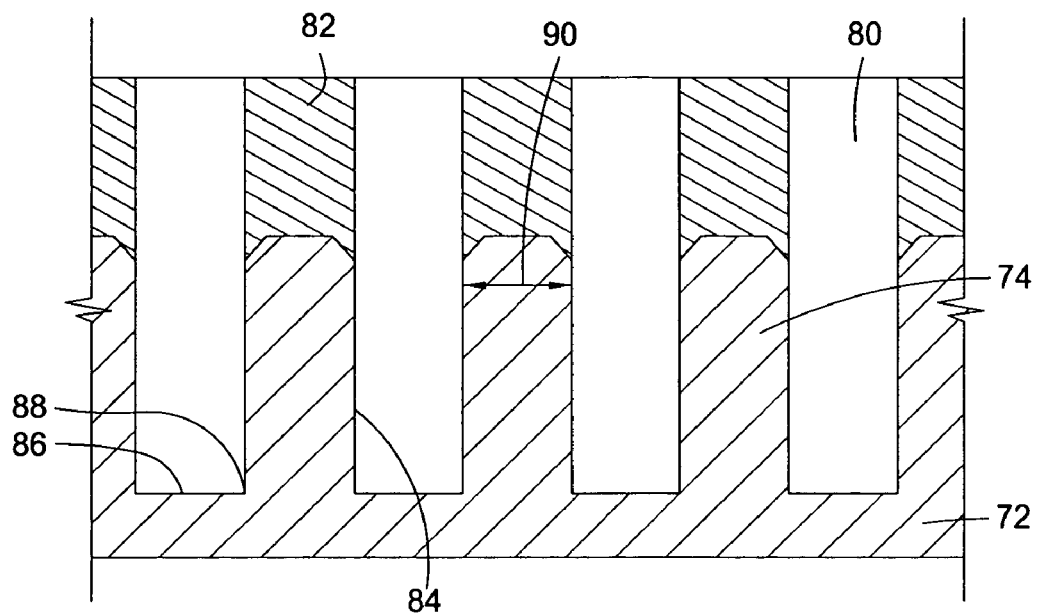
FIG. 10 is a line drawing of a scanning electron microscopy photograph, showing a patterned photoresist layer using the ARC of the present invention as an upper layer.

FIG. 10 is a line drawing of a scanning electron microscopy photograph, showing a cross section of a patterned photoresist layer 74 deposited over a SiC ARC 72 of the present invention. FIG. 10 shows the photolithography results of such embodiments as shown in FIG. 4, where the ARC is considered the top layer of the substrate prior to the photoresist layer deposition and photolithography processing. The width of the line 80 in the photoresist layer 74 is about a quarter micron, representative of the current size of features. With the SiC ARC 72 of the present invention, the photolithography patterning of the photoresist layer 74 resulted in even and straight lines 82, important for the ULSI reduced feature sizes. The patterning in the features was uniform and had straight, square sidewalls 84, i.e., no standing wave effects from extraneous light reflections, with a fully exposed bottom 86 and square corner 88 without a substantial rounded "footing" in the corner. The variation in minimum to maximum values of the photoresist width 90 between the lines is 5% or less, a standard acceptance range for processing. The repeatability from line to line is also shown. Thus, the uniformity of the patterned photoresist layer demonstrates that the SiC ARC of the present invention is able to produce a processed substrate with small features and still retain a low κ value, in contrast to other ARC materials, such as the silicon oxynitride ARC, described above.

The SiC deposited according to the present invention may also be used as a moisture barrier. The CMP process is typically a wet process and moisture can corrupt a substrate circuit. Therefore, a layer is preferably deposited on the substrate to prevent the adverse effects of moisture which could otherwise result from wet processing. If the SiC ARC is used as a polish stop and an upper layer, the SiC ARC would act as a moisture barrier.

Figure 11:
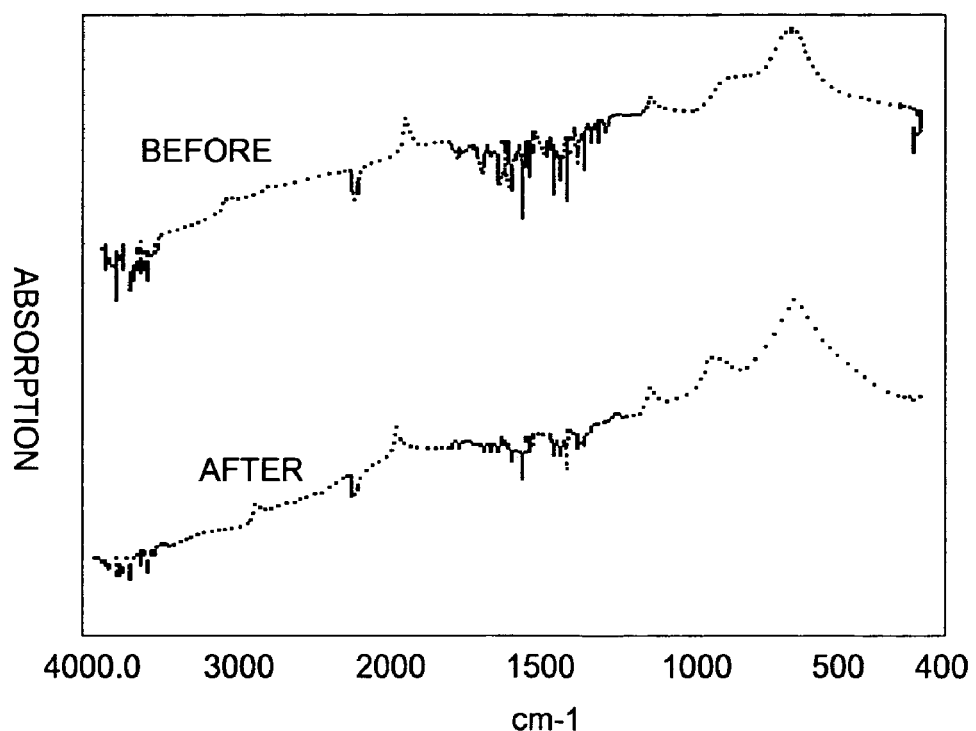
FIG. 11 is a FTIR chart of a moisture test of the SiC of the present invention, when the SiC is also used as a moisture barrier.

FIG. 11 shows the FTIR results of a moisture test of the SiC material exposed to boiling water for a 30 minute period. The upper line, showing the moisture results before the exposure, is offset from the lower line, showing the moisture results after the exposure, to view both lines on the same graph. Tests results show that the SiC of the present invention acts as a moisture barrier throughout the CMP process and thus satisfies the moisture barrier aspect, as well. The moisture level is particularly noted at wave number 1640, which is the H—OH peak, where the results are substantially the same between the two lines, indicating substantially no moisture absorption.

Figure 12:
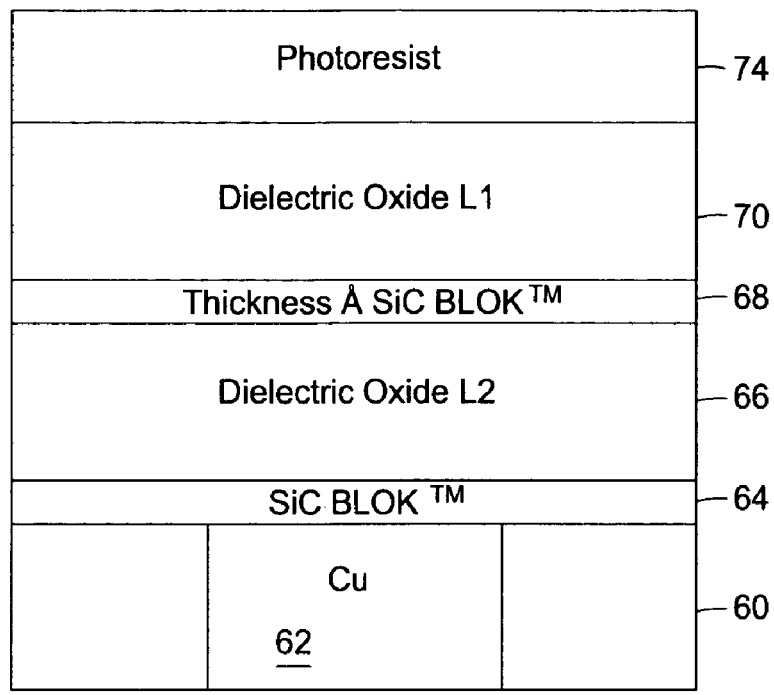
FIG. 12 is an alternative embodiment of FIG. 4, using the etch stop as the ARC without using an ARC upper layer.

FIG. 12 is an alternative embodiment of FIG. 4, without using a separate ARC. The stack relies on the properties of the SiC of the present invention between adjacent layers to function as an ARC, i.e., the etch stop 68 between the dielectric layers 66 and 70. The layers and numbers correspond to the arrangement described in FIG. 4, with the difference being no ARC 72 under the photoresist layer 74, shown in FIG. 12. Also, the plasma with the reducing agent can be used to reduce any oxides formed on the conductors, for instance, in features, prior to deposition of the subsequent layer. In this embodiment, the thickness of the dielectric layer 70 above the SiC etch stop 68 is adjusted in conjunction with the thickness of the SiC etch stop 68 between the dielectric layers 66 and 70 for a projected reflectivity. The thickness of the dielectric layer 66 is held constant. The photoresist layer 74 would be exposed as described above. The thickness of the barrier layer 64 is about 500 Å. In this embodiment, the substrate would rely on the reflective and absorptive characteristics of the SiC etch stop 68 below the upper dielectric layer 70. Thus, the thicknesses of the two layers are interdependent for a given projected reflectivity.

Figure 13:
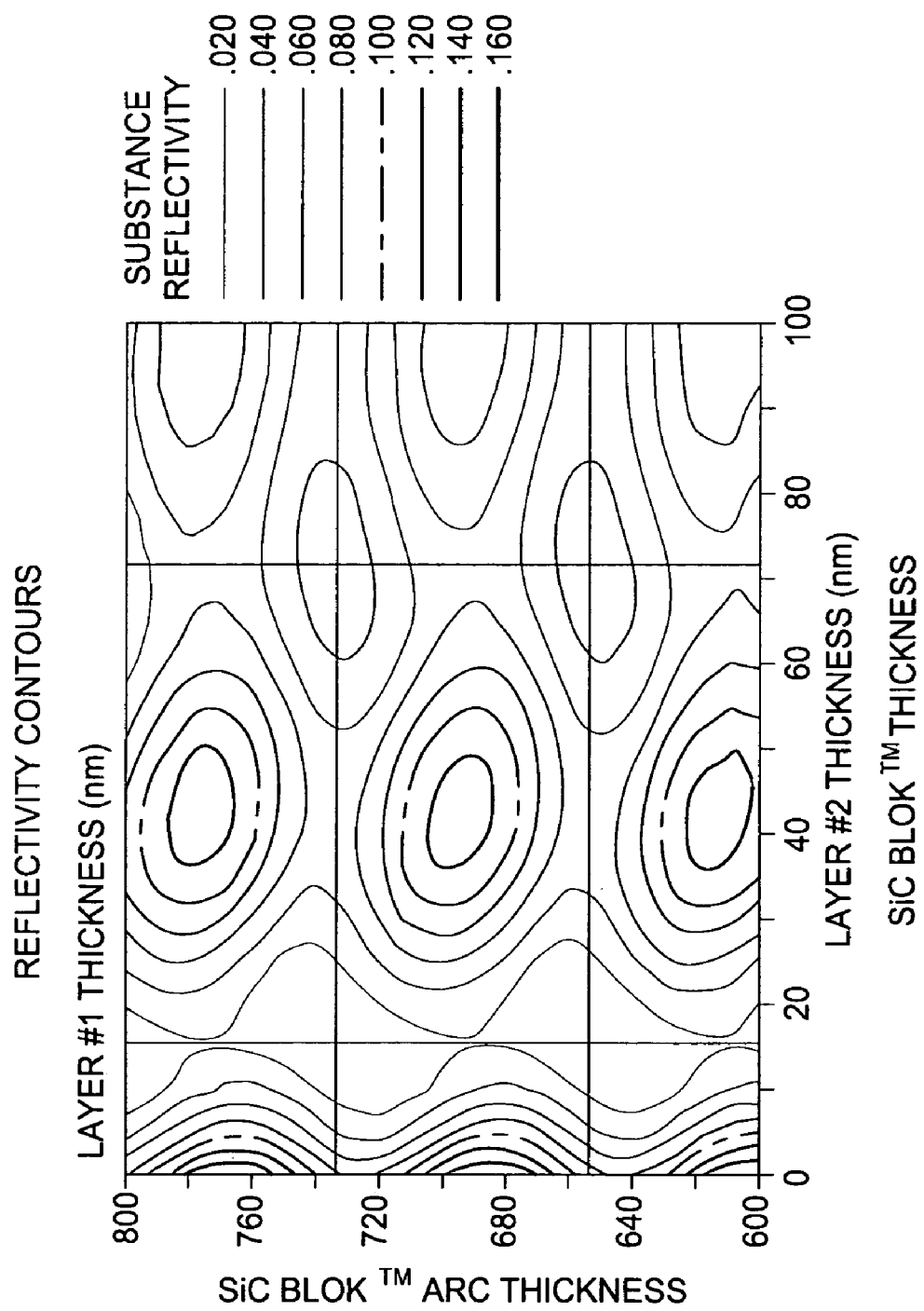
FIG. 13 is a reflectivity map of the embodiment of FIG. 12, showing the thicknesses of the upper dielectric layer compared to the etch stop.

FIG. 13 is a reflectivity map of the embodiment of FIG. 12, showing the thicknesses of the upper dielectric layer 70 compared to the etch stop 68. The y-axis represents the thickness of the dielectric layer 70 and the x-axis represents the thickness of the SiC etch stop 68. Similar to the discussion in FIG. 9, the appropriate thicknesses may be selected for given reflectivity ratios, such as below about 5%. For example, an etch stop thickness of about 150 Å, plus or minus about 50 Å, would optically satisfy the requirements for all the graphed thicknesses in FIG. 13 of the dielectric layer 70 and would have a reflectivity of less than about 5%.

Also, a SiC etch stop of about 720 Å thick could be used with a top dielectric layer thickness of about 6500 Å or about 7300 Å. The thicknesses shown in FIG. 13 and other similar figures are typical of the thicknesses used in commercial embodiments. Because the reflectivity pattern repeats, other layer thicknesses not charted could be used. If a higher level of reflectivity were allowed, for instance 6%, then an etch stop thickness of about 720 Å would also satisfy the optical requirements for reflectivity for all the graphed thicknesses on FIG. 13. Conversely, if the dielectric thickness was first selected and a resulting etch stop thickness determined, then, for example, a dielectric thickness of about 6600 Å and about 7400 Å with close tolerances could allow an etch stop thickness of about 100 Å to about 350 Å with a reflectivity of about 5% or less. These examples show that the thickness of the etch stop and the thickness of the dielectric layer adjacent the etch stop are to be considered with respect to each other when the SiC, functioning as an ARC, is between the dielectrics for a projected or chosen reflectivity.

Figure 14:
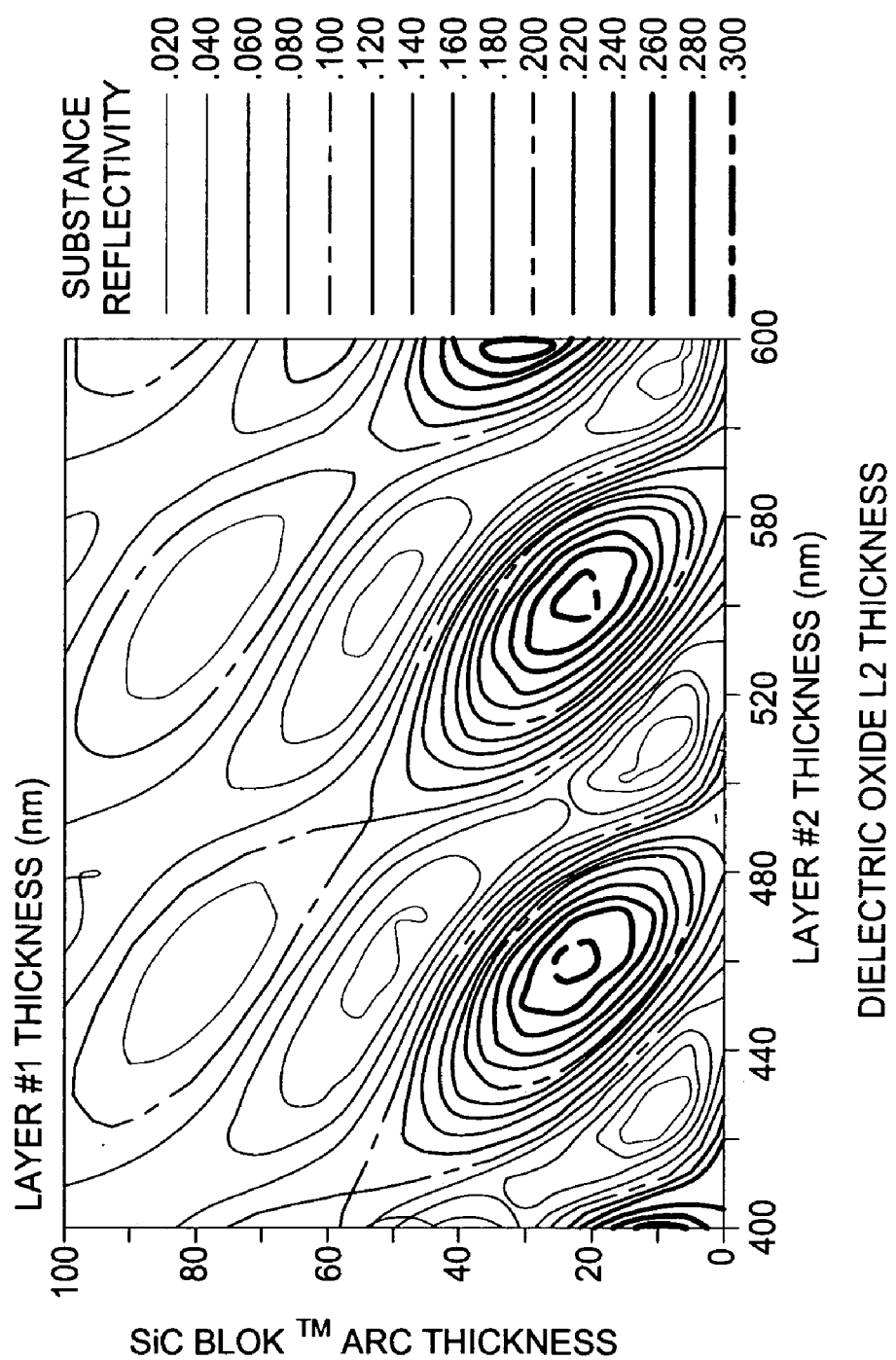
FIG. 14 is a reflectivity map of the embodiment of FIG. 12, showing the thicknesses of the etch stop compared to the lower dielectric layer under the etch stop.

FIG. 14 is another reflectivity map of the embodiment of FIG. 12, showing the thickness of the etch stop compared to the thickness of the lower dielectric layer under the etch stop. The thickness of the dielectric layer 66 below the etch stop 68 is adjusted in conjunction with the thickness of the etch stop 68 for a projected reflectivity. The upper dielectric layer 70 may remain a certain thickness, such as 7000 Å, while the thicknesses of the etch stop 68 and lower dielectric layer 66 are determined for a particular reflectivity. In FIG. 14, the etch stop thickness is represented by the y-axis and the dielectric layer 66 thickness is represented by the x-axis. For instance, with a 500 Å SiC etch stop, the thickness of the dielectric layer 66 could be about 4600 Å or about 5400 Å to maintain a 5% or less reflectivity. However, the thickness of the dielectric layer 66 may change for a different thickness of the dielectric layer 70. Thus, iterative solutions may be required to determine a thickness for each dielectric layer that satisfies the various process requirements and still collectively satisfy a reflectivity goal, here of about 5% or less.

Figure 15:
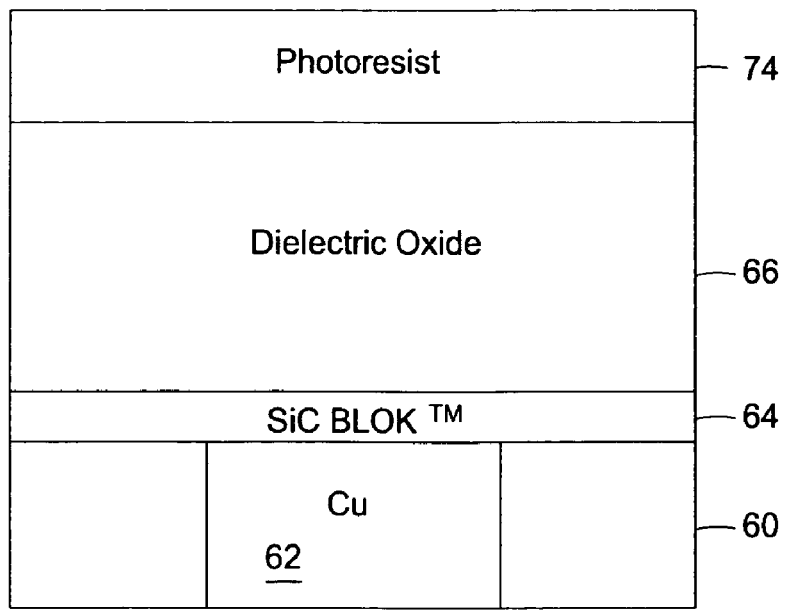
FIG. 15 is an alternative embodiment of FIGS. 4 and 12, without the etch stop and using the barrier layer as the ARC.

FIG. 15 is an alternative embodiment of FIGS. 4 and 12 without the etch stop, where the barrier layer 64 is used as the ARC. The layers and numbers correspond to the arrangement described in FIGS. 4 and 12, with the difference being no ARC 72 under the photoresist 74, shown in FIGS. 12 and 15, and no etch stop 68. Also, the plasma with the reducing agent can be used to reduce any oxides formed on the conductors, for instance, in features, prior to deposition of the subsequent layer. If the etch stop is eliminated, then the substrate processing throughput is increased by having fewer steps and a lower effective dielectric constant of the substrate may be obtained. If the process is well characterized and has sufficient control of the etching rate and depth, then the etch stop may not be needed. In the embodiment of FIG. 15, the thickness of the dielectric layer 66 is increased to compensate for the lack of the second dielectric layer 70 so that the circuit is electrically isolated and may be about 10,000 Å to about 12,000 Å thick. The dielectric layer 66 thickness is adjusted in conjunction with the thickness of the SiC barrier layer 64 for a projected reflectivity. The photoresist 74 would be exposed as described above. However, the substrate would rely on the reflective and absorptive characteristics of the SiC barrier layer 64 below the dielectric layer 66, where the thicknesses of the two layers are interdependent or independent, depending upon the thickness(es) selected and the desired reflectivity.

Figure 16:
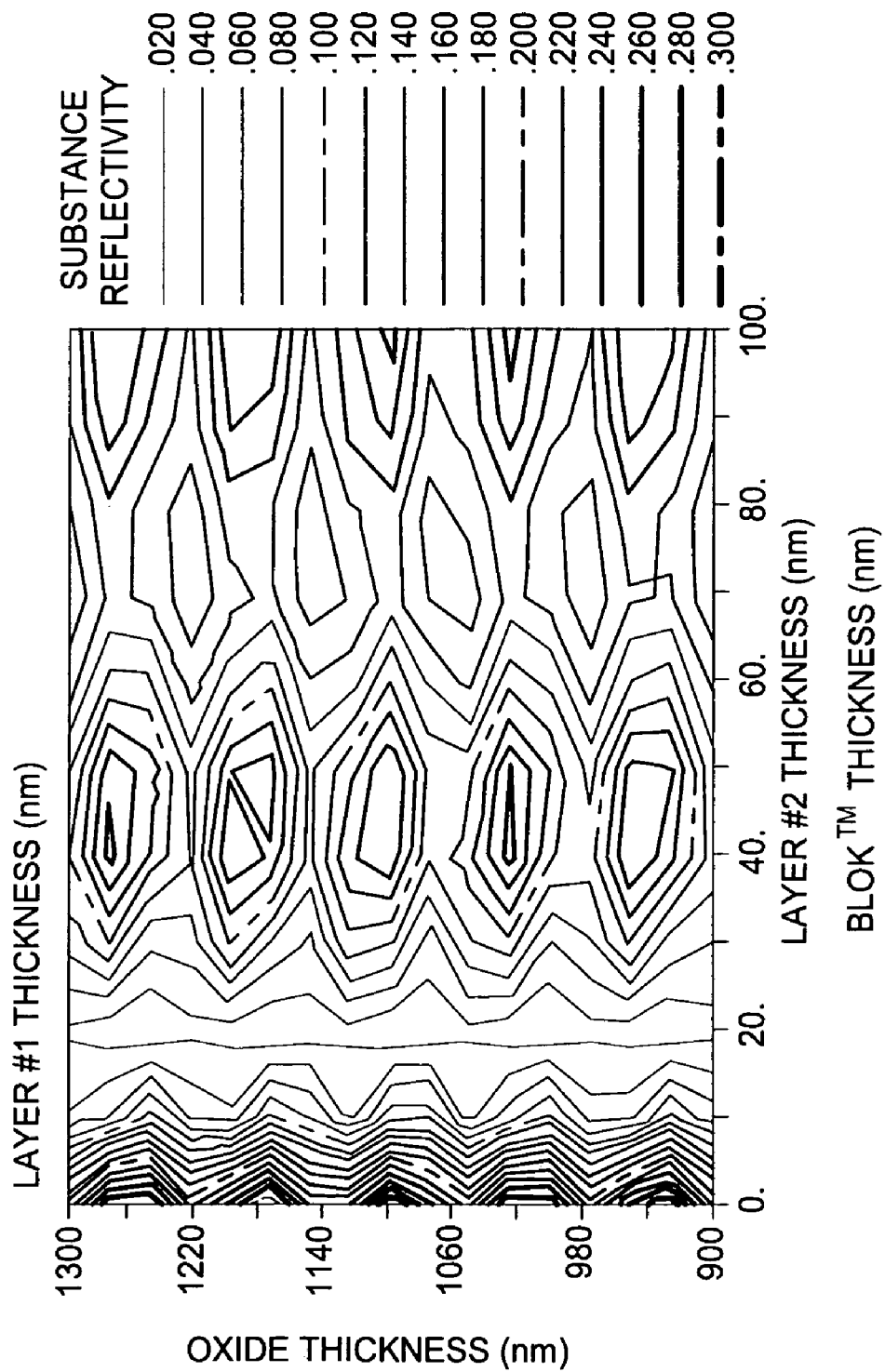
FIG. 16 is a reflectivity map of the embodiment of FIG. 15, showing the thicknesses of the dielectric layer above the barrier layer compared to the barrier layer, using the barrier layer as an ARC.

FIG. 16 is a reflectivity map of the embodiment of FIG. 15, showing the thicknesses of the dielectric layer 66 compared to the SiC barrier layer 64. In FIG. 16, the y-axis represents the dielectric layer thickness and the x-axis represents the barrier layer thickness. A preferred thickness of the SiC barrier layer when used as an ARC, without the intervening etch stop, is about 700 to about 800 Å. The preferred thickness yields a predicted 5% reflectivity or less for all graphed thickness of the dielectric layer, and, thus, the SiC provides ARC optical results substantially independent of the dielectric layer thickness.

Figure 17:
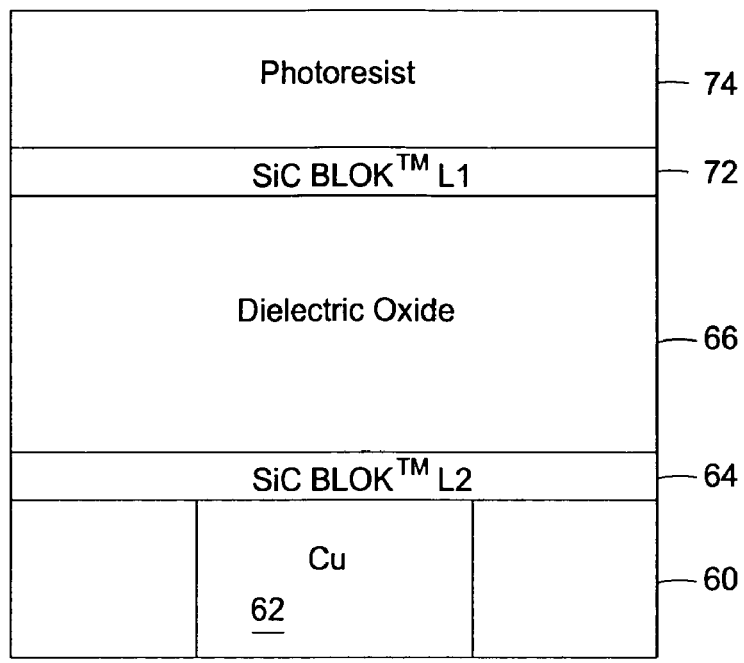
FIG. 17 is another embodiment similar to the embodiment of FIG. 15 with the addition of a SiC ARC layer below the photoresist layer.
Figure 18:
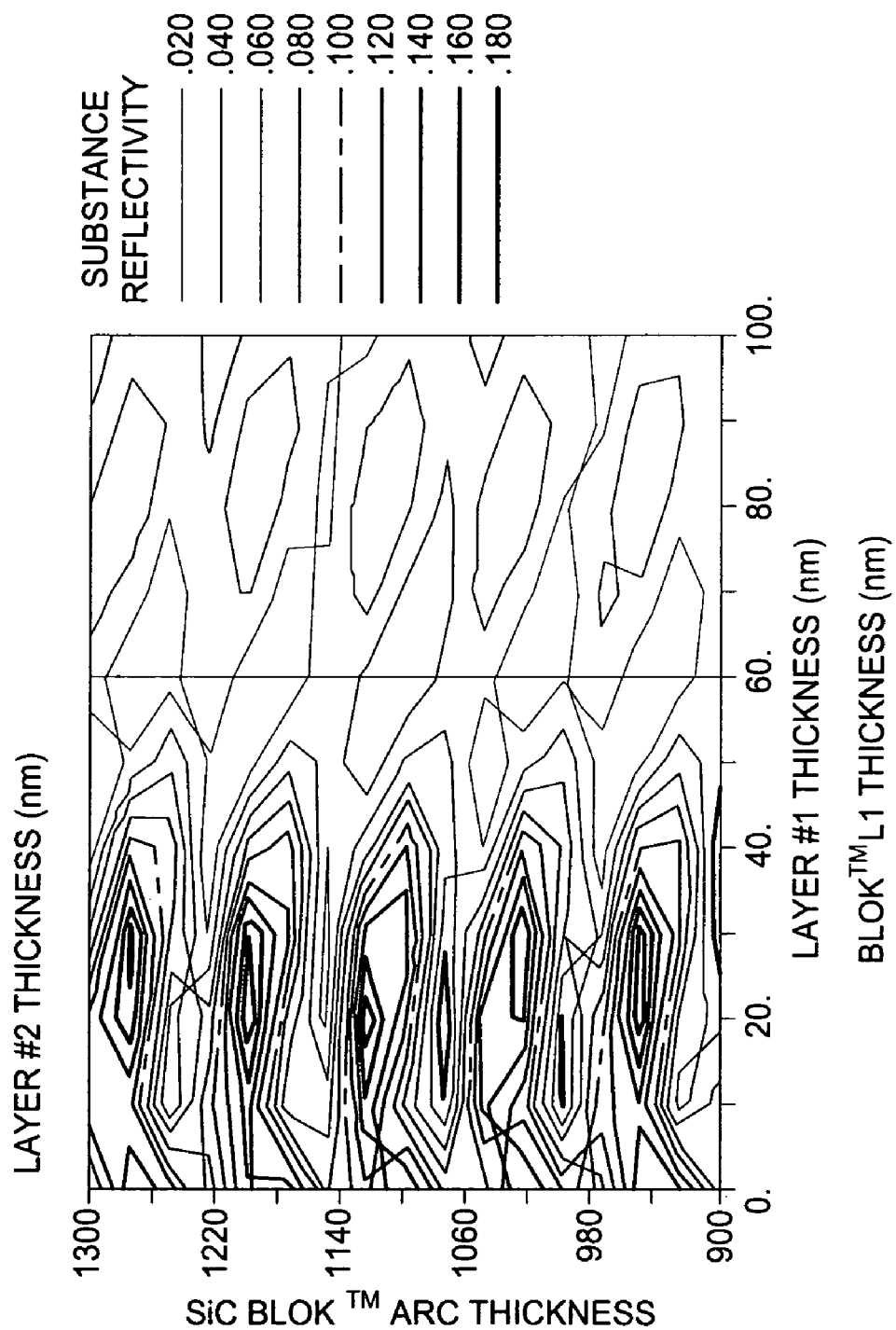
FIG. 18 is a reflectivity map of the embodiment of FIG. 17, showing the thickness of the ARC compared to the thickness of the dielectric layer under the ARC.

FIG. 17 is another embodiment similar to the embodiment of FIG. 15 with the use of SiC below the photoresist layer 74, as an ARC. The etch stop 68 of FIG. 4 is not used in the embodiment of FIG. 17 and the dielectric layer 66 is typically thicker, e.g., about 10,000 Å to about 12,000 Å, than the separate dielectric layers of FIG. 4. The SiC barrier layer 64 is about 500 Å thick, although the thickness could vary. As shown in FIG. 18 below, the thickness of the dielectric layer 66 can vary without significantly affecting the reflectivity on the photoresist layer 74, when the SiC ARC 72 thickness is appropriately selected.

FIG. 18 is a reflectivity map of the embodiment of FIG. 17, showing the thickness of the ARC compared to the thickness of the dielectric layer under the ARC for a projected reflectivity. In FIG. 18, the ARC 72 thickness is represented on the x-axis and the dielectric layer 66 thickness is represented on the y-axis. The reflectivity map shows that with an ARC thickness of about 520 Å or greater, any of the graphed thickness of the dielectric layer 66 may result in a reflectivity of about 5% or less. A preferred thickness of the SiC ARC is about 600 Å. The pattern repeats, as in other reflectivity maps, and thus other thicknesses of the oxide and/or SiC layer could be determined by extrapolation. Using the SiC of the present invention, the ARC layer may be a deposition thickness of about 600 Å, regardless of the underlying layer thickness to obtain a projected reflectivity of about 5% or less.

Figure 19:
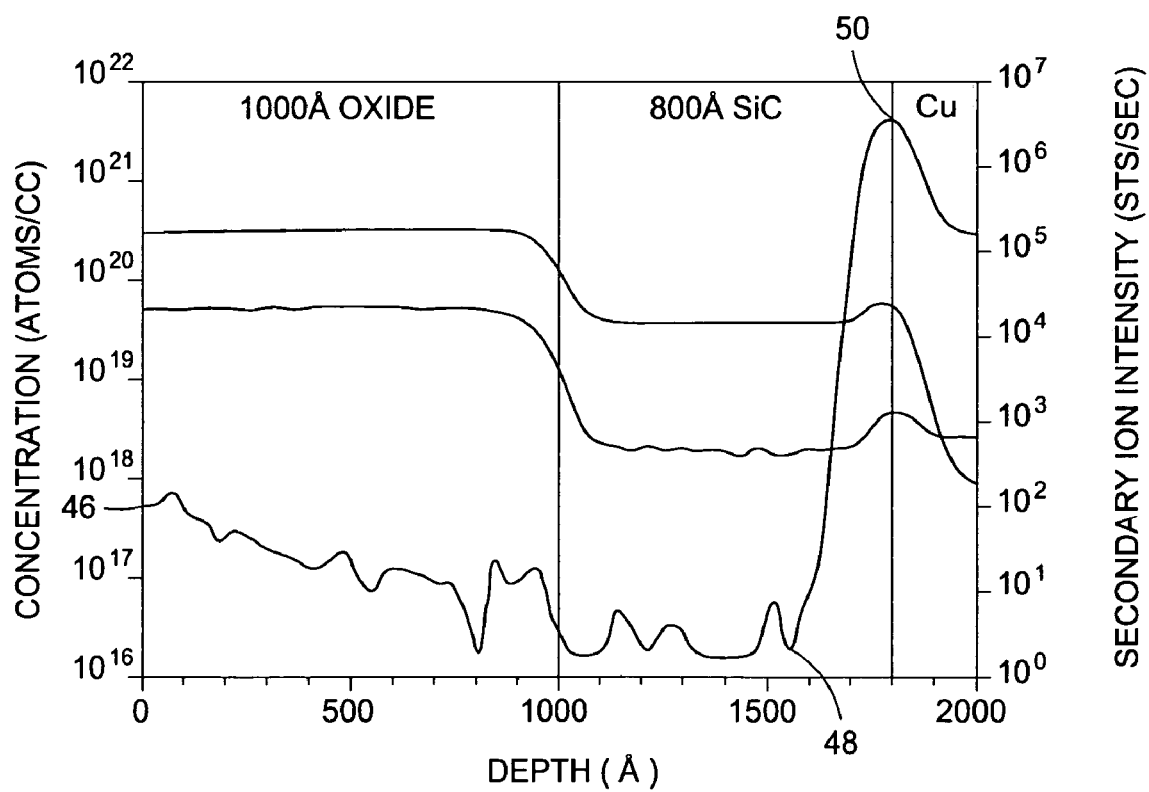
FIG. 19 is a graph of copper diffusion into the SiC material of the present invention.

Because the SiC of the present invention may be used in proximity to conductive materials, such a copper, that are prone to diffusion through adjacent layers, it is preferable that the SiC be diffusion resistant, as well. FIG. 19 shows the test specimen diffusion results, where the lower curve shows the copper content, showing the diffusion resistance to copper of the SiC material of the present invention. The test specimen was a substrate with a 200 Å layer of copper, a 800 Å layer of SiC deposited on the copper, and a 1000 Å layer of oxide deposited on the SiC. Starting with the y-axis, FIG. 19 shows a value 46 of approximately $3 \times 10^{17}$ atoms per cubic centimeter (atoms/cc) at a depth of 0 Å from the surface of the 1000 Å oxide layer. This value reduces to value 48 of about $1 \times 10^{16}$ atoms/cc through the oxide layer and into the 800 Å SiC layer at a combined depth of about 1570 Å. The copper diffusion level then rises logarithmically for the next 230 Å to a value 50 of approximately $3 \times 10^{21}$ atoms/cc at the copper to copper barrier interface. Thus, the copper level reduces by approximately four orders of magnitude, i.e., 1/10,000, within about 200 Å to 250 Å of the interface. This decrease in the copper level shows the effectiveness of the SiC material of the present invention.

The present invention further provides a substrate processing system having a plasma reactor including a chamber, a reaction zone in the chamber, a substrate holder for positioning a substrate in the reaction zone, and a vacuum system. The processing system further comprises a gas/liquid distribution system connecting the reaction zone of the vacuum chamber that supplies an silane-based compound, an inert gas, and an RF generator coupled to the gas distribution system for generating a plasma in the reaction zone. The processing system further includes a controller comprising a computer for controlling the plasma reactor, the gas distribution system, the RF generator, and a memory coupled to the controller, the memory comprising a computer usable medium including a computer readable program code for selecting the process steps for depositing a low dielectric constant film with a plasma of an silane-based compound.

The processing system may further comprise in one embodiment computer readable program code for selecting the process steps for depositing a barrier layer and/or etch stop of the silane-based compound, depositing a different dielectric layer, and optionally depositing a capping passivation layer of the silane-based compound.

The embodiments shown and described are not intended to limit the invention except as provided by the appended claims. Furthermore, in the embodiments, the order of the layers may be modified and thus, the term "deposited on" and the like in the description and the claims includes a layer deposited above the prior layer but not necessarily immediately adjacent the prior layer and can be higher in the stack. For instance, without limitation, various liner layers could be deposited adjacent dielectric layers, barrier layers, etch stops, metal layers, and other layers.

While foregoing is directed to the preferred embodiment of the present invention, other and further embodiments of the invention may be devised without departing from the basic scope thereof, and the scope thereof is determined by the claims that follow. Furthermore, in this specification, including particularly the claims, the use of "comprising" with "a" or "the", and variations thereof means that the item(s) or list(s) referenced includes at least the enumerated item(s) or list(s) and furthermore may include a plurality of the enumerated item(s) or list(s), unless otherwise stated. Also, any disclosure of methods, including the claims, are presented in a logical order, but are not restricted to the sequence disclosed unless specifically stated.

What is claimed is:

1. A method of forming a silicon carbide layer on a substrate, comprising:

introducing silicon, carbon, and a noble gas into a chamber;

initiating a plasma in the chamber;

reacting the silicon and the carbon in the presence of the plasma to deposit a silicon carbide layer having a dielectric constant less than 7.0 on the substrate in the chamber;

depositing a first dielectric layer in situ on the silicon carbide layer, wherein the first dielectric layer comprises a silicon-oxygen-carbon based material deposited from the plasma enhanced chemical vapor deposition of an organosiloxane, a disilano compound, or combinations thereof; and then depositing a photoresist layer.

2. The method of claim 1, further comprising:
depositing a silicon carbide etch stop in situ on the first dielectric layer; and
depositing a second dielectric layer in situ on the silicon carbide etch stop prior to depositing the photoresist layer.

3. The method of claim 2, further comprising depositing a silicon carbide anti-reflective coating in situ on the second dielectric layer prior to depositing the photoresist layer.

4. The method of claim 2, wherein the photoresist layer is deposited on the second dielectric layer.

5. The method of claim 4, further comprising:
depositing a silicon carbide layer on the first dielectric layer prior to depositing the photoresist layer.

6. The method of claim 1, further comprising depositing a silicon carbide anti-reflective coating in situ on the first dielectric layer prior to depositing the photoresist layer.

7. The method of claim 1, wherein the substrate has an effective dielectric constant of no greater than about 5.

8. The method of claim 1, wherein the silicon and the carbon are derived from an organosilane compound, substantially independent of other carbon sources.

9. The method of claim 1, wherein the silicon and the carbon are derived from a common source, and reacting the silicon and the carbon in the presence of the plasma to form silicon carbide occurs independent of the presence of a separate hydrogen source.

10. The method of claim 1, wherein the silicon and the carbon are derived from a common source and reacting the silicon and the carbon in the presence of the plasma to form silicon carbide occurs independent of the presence of a separate carbon source.

11. The method of claim 1, further comprising patterning and etching the substrate to form a damascene structure.

12. The method of claim 1, wherein the silicon carbide layer is an anti-reflective coating that has a single selected thickness to produce a reflectivity of about 7 percent or less when an underlying dielectric layer below the anti-reflective coating has a thickness from about 5000 Å to about 10000 Å.

13. A method of in situ deposition of silicon carbide on a substrate, comprising:
depositing a silicon carbide barrier layer on the substrate;
depositing a first dielectric layer in situ on the barrier layer, wherein the first dielectric layer comprises a silicon-oxygen-carbon based material deposited from the plasma enhanced, chemical vapor deposition of an organosiloxane, a disilano compound, or combinations thereof;
depositing an etch stop in situ on the first dielectric layer;
depositing a second dielectric layer in situ on the etch stop;
depositing a silicon carbide anti-reflective coating in situ on the second dielectric layer; and
depositing a photoresist layer on the silicon carbide anti-reflective coating.

14. The method of claim 13, wherein the barrier layer, etch stop, and anti-reflective coating each comprises silicon carbide material having a dielectric constant less than 7.0.

15. The method of claim 13, wherein the substrate has an effective dielectric constant of no greater than about 5.

16. The method of claim 13, further comprising removing a contaminant on the substrate by:
a) introducing a reducing agent comprising nitrogen and hydrogen into a chamber;
b) initiating a reducing plasma in the chamber;
c) exposing an oxide on the substrate to the reducing agent.

17. The method of claim 11, further comprising filling the damascene structure with a liner layer and a conductive material to form a damascene feature.

18. The method of claim 17, further comprising depositing a silicon carbide barrier layer over the damascene feature.

19. The method of claim 1, wherein the first dielectric layer is deposited from an organosiloxane selected from the group consisting of 1,3-dimethyldisiloxane, 1,3-bis(silanomethylene)disiloxane, bis(1-methyldisiloxanyl)methane, 2,2-bis(1-methyldisiloxanyl)propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, fluorinated derivatives thereof, and combinations thereof.

20. The method of claim 1, wherein the first dielectric layer is deposited from an organosiloxane selected from the group consisting of disilanomethane, bis(methylsilano)methane, 1,2-disilanoethane, 1,2-bis(methylsilano)ethane, 2,2-disilanopropane, 1,3,5-trisilano-2,4,6-trimethylene, and combinations thereof.

21. The method of claim 13, wherein the first dielectric layer is deposited from an organosiloxane selected from the group consisting of 1,3-dimethyldisiloxane, 1,3-bis(silanomethylene)disiloxane, bis(1-methyldisiloxanyl)methane, 2,2-bis(1-methyldisiloxanyl)propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, fluorinated derivatives thereof, and combinations thereof.

22. The method of claim 13, wherein the first dielectric layer is deposited from an organosiloxane, selected from the group consisting of disilanomethane, bis(methylsilano)methane, 1,2-disilanoethane, 1,2-bis(methylsilano)ethane, 2,2-disilanopropane, 1,3,5-trisilano-2,4,6-trimethylene, and combinations thereof.

* * * * *

UNITED STATES PATENT AND TRADEMARK OFFICE
CERTIFICATE OF CORRECTION

PATENT NO. : 6,974,766 B1
APPLICATION NO. : 09/270039
DATED : December 13, 2005
INVENTOR(S) : Judy H. Huang It is certified that error appears in the above-identified patent and that said Letters Patent is hereby corrected as shown below:

In the Specification

Column 8, Line 50: After "such", change "a" to --as--

Column 10, Line 35: Before "stack", insert --substrate--

Column 11, Line 34: Change "dimethysilane" to --dimethylsilane--

Column 12, Table 2: Change "(Watts/"in$^2$)" to --(Watts/in$^2$)--

Column 12, Line 32: After "centimeters", insert --per minute--

Column 14, Line 50: Change "orqanosiloxane" to --organosiloxane--

Column 14, Line 61: Change "—CH$_3$—" to -- —CH$_2$— --

Column 15, Line 19: Change "Ch$_3$—SiH$_2$—O—SiH$_2$)$_2$—CH$_2$" to --CH$_3$—SiH$_2$—O—SiH$_2$—)$_2$—CH$_2$--

Column 15, Line 47: Change "is" to --in--

Column 19, Line 49: Before "copper", change "a" to --as--

Column 20, Line 9: After "supplies", change "an" to --a--

Column 20, Line 18: Before "silane-based", change "an" to --a--

UNITED STATES PATENT AND TRADEMARK OFFICE
CERTIFICATE OF CORRECTION

PATENT NO.        : 6,974,766 B1
APPLICATION NO. : 09/270039
DATED             : December 13, 2005
INVENTOR(S)      : Judy H. Huang It is certified that error appears in the above-identified patent and that said Letters Patent is hereby corrected as shown below:

<u>In the Claims</u>

Column 21, Claim 5, Line 12: Change "4" to --1--

Column 21, Claim 13, Line 47: Delete the comma after "enhanced"

Column 22, Claim 22, Line 46: Delete the comma after "organosiloxane"

Signed and Sealed this

Third Day of October, 2006

JON W. DUDAS
*Director of the United States Patent and Trademark Office*